United States Patent
Murata

(10) Patent No.: US 10,341,620 B2
(45) Date of Patent: Jul. 2, 2019

(54) IMAGE SENSOR AND IMAGE-CAPTURING DEVICE

(71) Applicant: NIKON CORPORATION, Tokyo (JP)

(72) Inventor: Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/845,408

(22) Filed: Dec. 18, 2017

(65) Prior Publication Data

US 2018/0109768 A1   Apr. 19, 2018

Related U.S. Application Data

(63) Continuation of application No. 14/389,458, filed as application No. PCT/JP2013/059622 on Mar. 29, 2013, now abandoned.

(30) Foreign Application Priority Data

Mar. 30, 2012   (JP) .................................. 2012-081167

(51) Int. Cl.
  *H04N 5/335*   (2011.01)
  *H04N 9/04*   (2006.01)
  (Continued)

(52) U.S. Cl.
  CPC ....... *H04N 9/045* (2013.01); *H01L 27/14603* (2013.01); *H01L 27/14627* (2013.01); *H01L 27/14645* (2013.01); *H04N 5/3696* (2013.01); *G02B 3/0056* (2013.01); *G02B 7/34* (2013.01); *H01L 27/1469* (2013.01);
  (Continued)

(58) Field of Classification Search
  CPC .. H04N 5/3696; H04N 5/23212; H04N 9/045; H01L 27/14645; H01L 27/14603; H01L 27/14627; H01L 27/14621; H01L 27/14634; H01L 27/14641; H01L 27/14649; G02B 3/0056; G02B 7/34
  See application file for complete search history.

(56) References Cited

U.S. PATENT DOCUMENTS 7,522,341 B2   4/2009  Mouli
7,711,261 B2   5/2010  Kusaka
(Continued)

FOREIGN PATENT DOCUMENTS

CN  101854488 A  10/2010
JP  2006-049361 A  2/2006
(Continued)

OTHER PUBLICATIONS

Dec. 22, 2017 Office Action issued in Chinese Application No. 201380018192.2.
(Continued)

*Primary Examiner* — Lin Ye
*Assistant Examiner* — John H Morehead, III
(74) *Attorney, Agent, or Firm* — Oliff PLC

(57) ABSTRACT

An image sensor includes: a plurality of microlenses arranged in a two-dimensional pattern; and a plurality of pixels that are provided in correspondence to each of the microlenses and receive lights of different color components, respectively. Pixels that are provided at adjacent microlenses among the microlenses and that receive lights of same color components, are adjacently arranged.

18 Claims, 22 Drawing Sheets

(51) Int. Cl.
  *H01L 27/146* (2006.01)
  *H04N 5/369* (2011.01)
  *G02B 7/34* (2006.01)
  *H04N 5/232* (2006.01)
  *G02B 3/00* (2006.01)

(52) U.S. Cl.
  CPC .. *H01L 27/14621* (2013.01); *H01L 27/14634* (2013.01); *H01L 27/14641* (2013.01); *H04N 5/23212* (2013.01)

(56) References Cited

U.S. PATENT DOCUMENTS

| | | | |
|---|---|---|---|
| 2006/0023109 | A1 | 2/2006 | Mabuchi et al. |
| 2006/0087572 | A1 | 4/2006 | Schroeder |
| 2006/0266921 | A1 | 11/2006 | Kang et al. |
| 2010/0117126 | A1 | 5/2010 | Takahashi |
| 2010/0123809 | A1* | 5/2010 | Egawa ................ H04N 5/2257 348/280 |
| 2010/0238330 | A1* | 9/2010 | Hirota ............... H01L 27/14621 348/273 |
| 2010/0276572 | A1* | 11/2010 | Iwabuchi ............. H01L 23/481 250/208.1 |
| 2011/0115893 | A1 | 5/2011 | Hayashi |
| 2012/0044406 | A1 | 2/2012 | Shimoda et al. |
| 2012/0057056 | A1 | 3/2012 | Oike |
| 2012/0153419 | A1 | 6/2012 | Itonaga et al. |
| 2012/0242876 | A1* | 9/2012 | Hagiwara ......... H01L 27/14618 348/294 |
| 2013/0057735 | A1 | 3/2013 | Hirota |
| 2013/0222553 | A1 | 8/2013 | Tsuchita |
| 2013/0335604 | A1 | 12/2013 | Hirota |

FOREIGN PATENT DOCUMENTS

| | | |
|---|---|---|
| JP | 2007-281296 A | 10/2007 |
| JP | 2007-282109 A | 10/2007 |
| JP | 2007-317951 A | 12/2007 |
| JP | 2008-153370 A | 7/2008 |
| JP | 2010-239337 A | 10/2010 |
| WO | 2006/129762 A1 | 12/2006 |
| WO | 2012/039180 A1 | 3/2012 |

OTHER PUBLICATIONS

Sep. 15, 2015 Extended European Search Report issued in European Patent Application No. 13768698.6.
Jun. 7, 2016 U.S. Office Action issued in U.S. Appl. No. 14/389,458.
Dec. 1, 2016 Office Action issued in U.S. Appl. No. 14/389,458.
Feb. 28, 2017 Office Action issued in Chinese Application No. 201380018192.2.
Aug. 16, 2017 Office Action issued in U.S. Appl. No. 14/389,458.
May 23, 2017 Office Action issued in Japanese Patent Application No. 2014-508110.
May 28, 2013 International Search Report issued in International Application No. PCT/JP2013/059622.
Sep. 11, 2015 U.S. Office Action issued in U.S. Appl. No. 14/389,458.
Dec. 14, 2017 Office Action issued in European Application No. 13 768 698.6.
Feb. 27, 2018 Office Action issued in Japanese Application No. 2014-508110.
Oct. 30, 2018 Summons to Attend Oral Proceedings in European Application No. 13768698.6.
Jan. 25, 2019 Office Action issued in Indian Patent Application No. 8650/DELNP/2014.
Apr. 5, 2019 Office Action issued in U.S. Appl. No. 16/234,161.

* cited by examiner

FIG.2
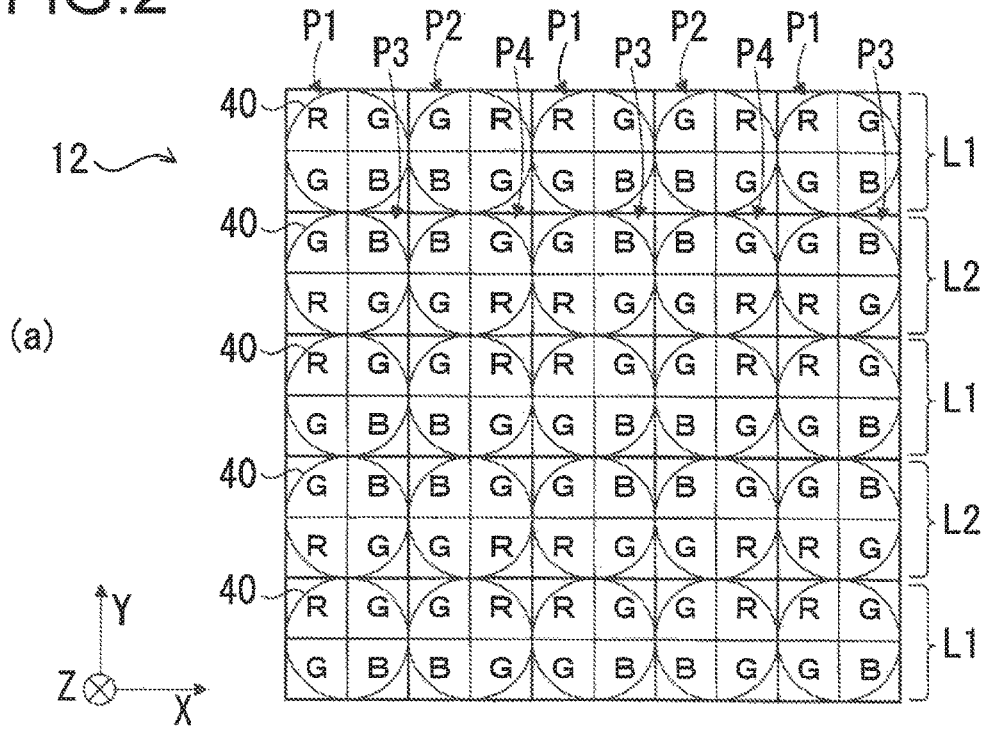
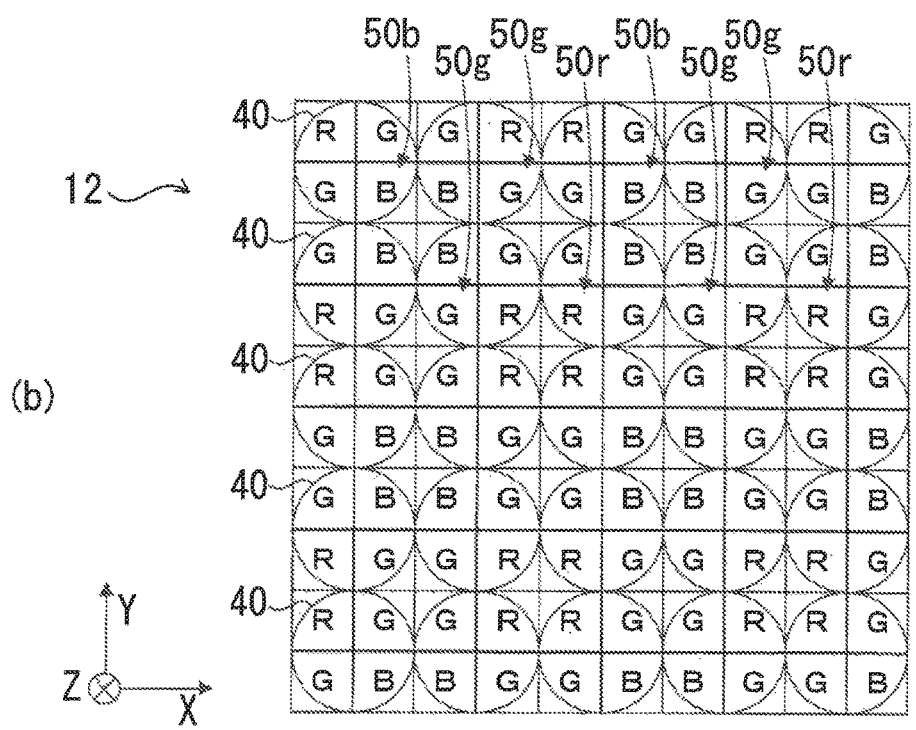

FIG.12
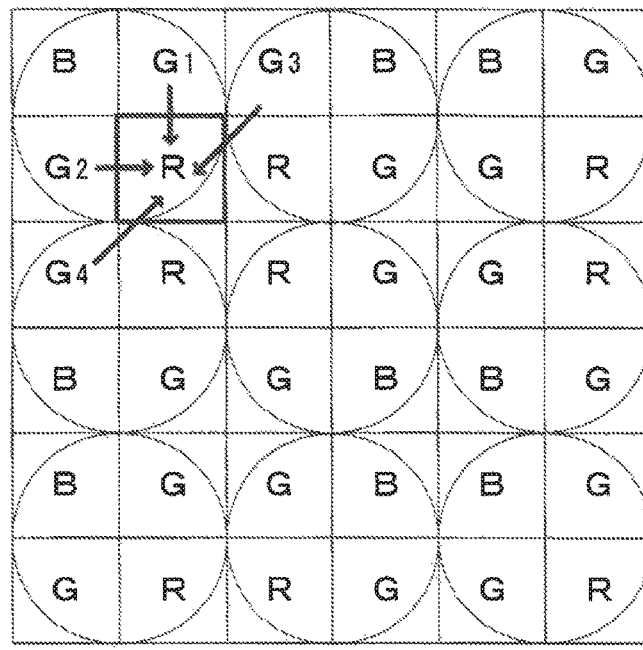
(a)
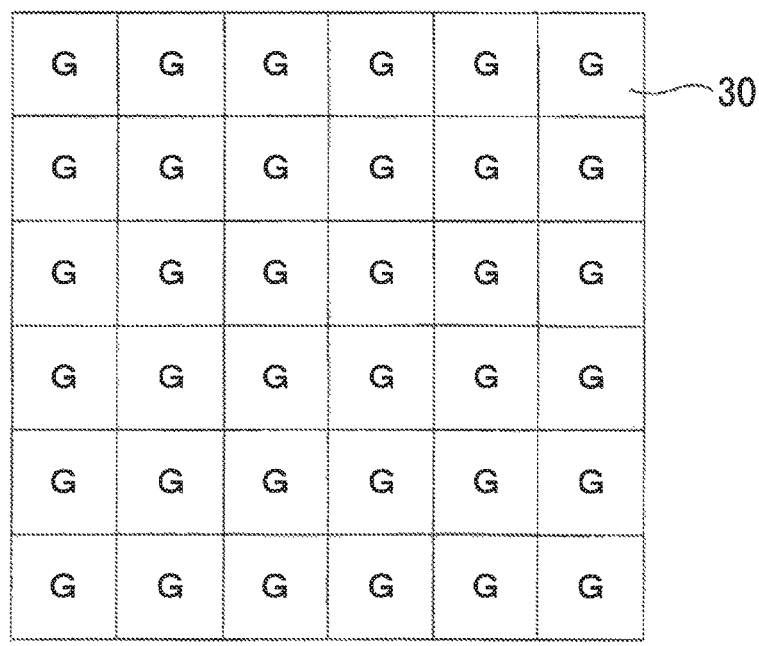
(b)

FIG.14
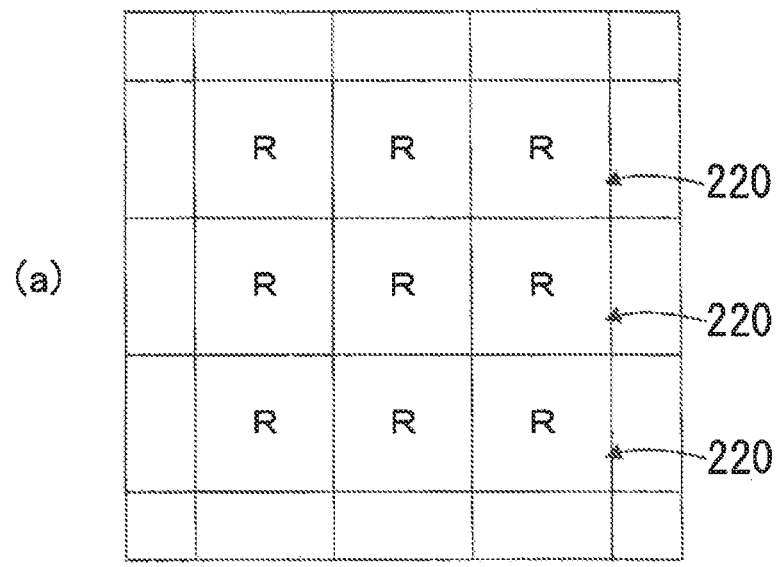
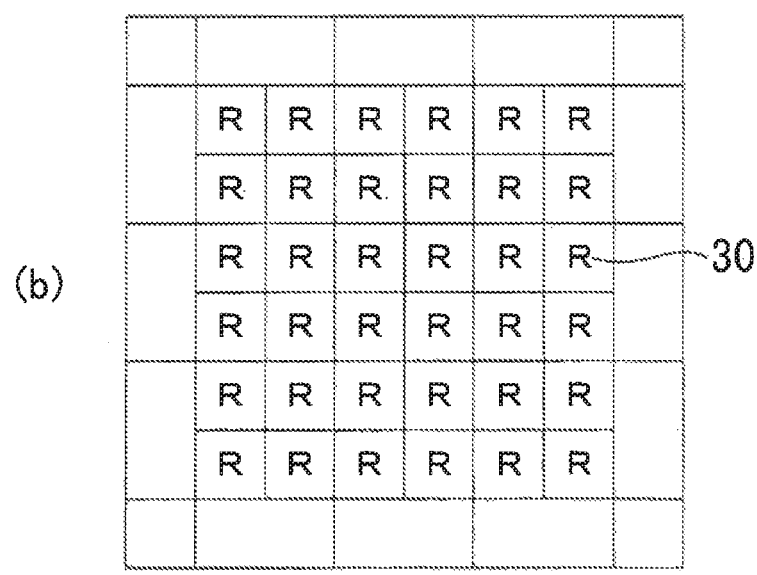

FIG.15
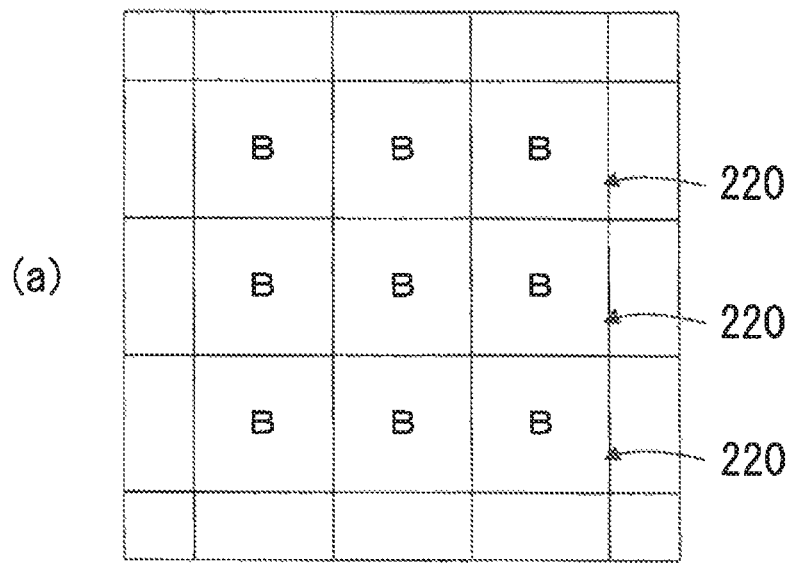
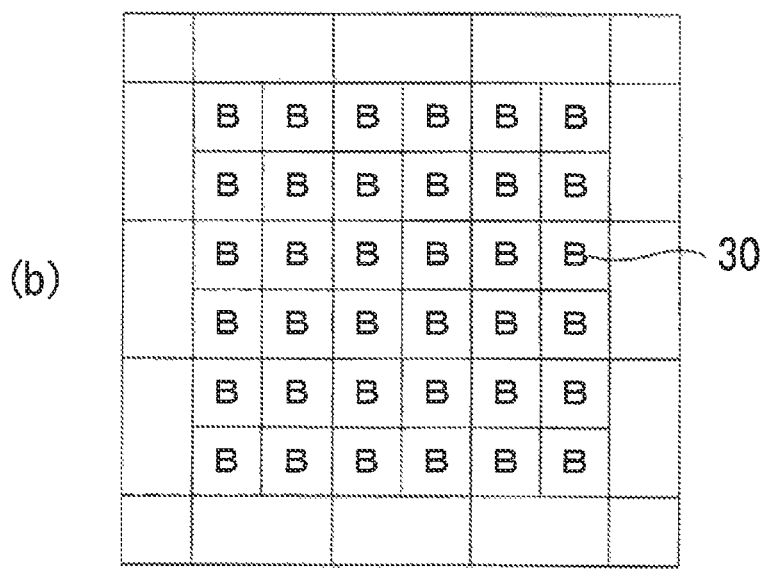

| RGB | RGB | RGB | RGB | RGB | RGB | RGB | RGB | RGB | RGB |
|---|---|---|---|---|---|---|---|---|---|
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |

~30

(b)

| YCrCb | YCrCb | YCrCb | YCrCb | YCrCb | YCrCb | YCrCb | YCrCb | YCrCb |
|---|---|---|---|---|---|---|---|---|
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |
| YCrCb | YCrCb | YCrCb | YCrCb | YCrCb | YCrCb | YCrCb | YCrCb | YCrCb |

~30

FIG.18
(a) 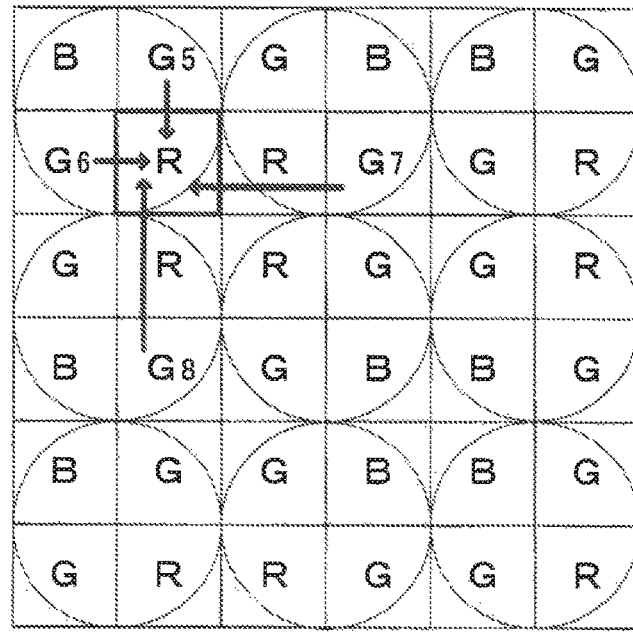
(b) 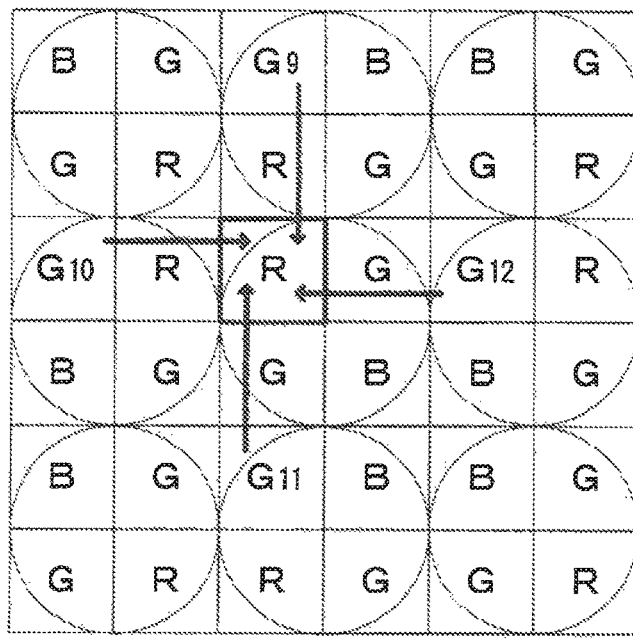

FIG.20
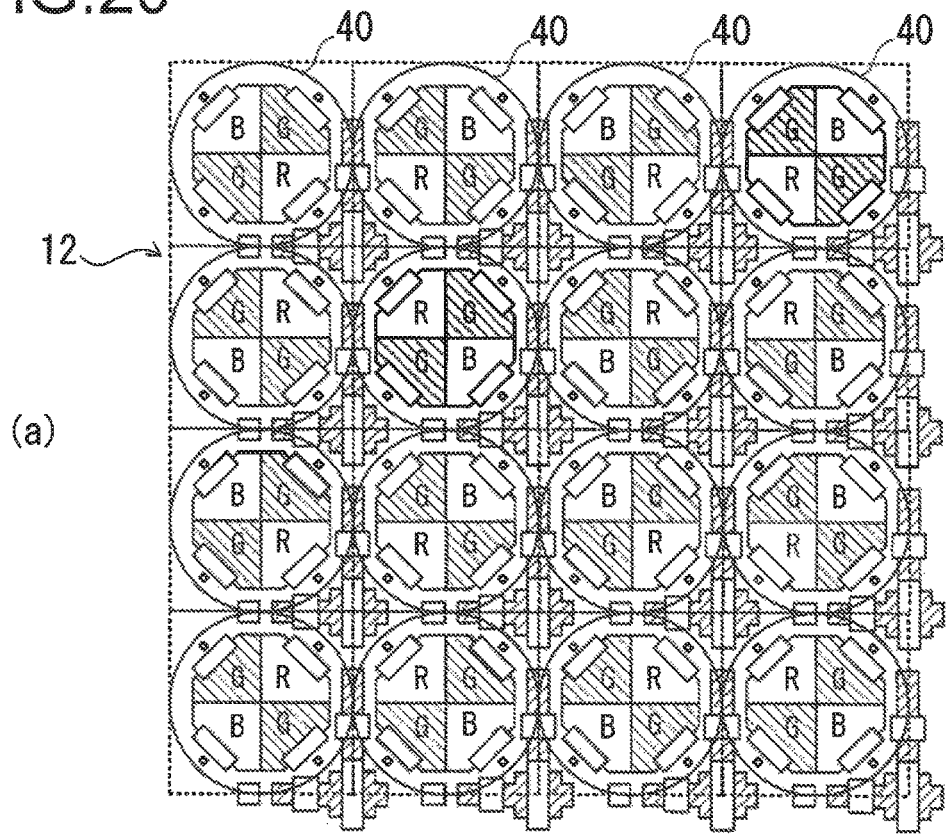
(a)
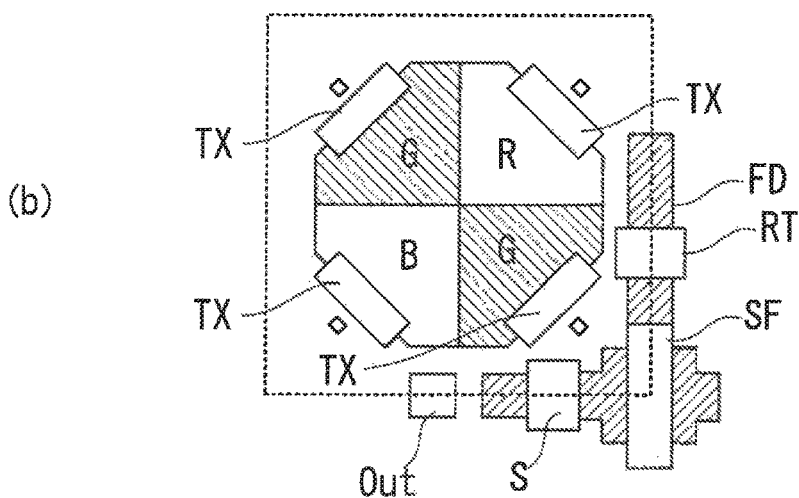
(b)

FIG.21
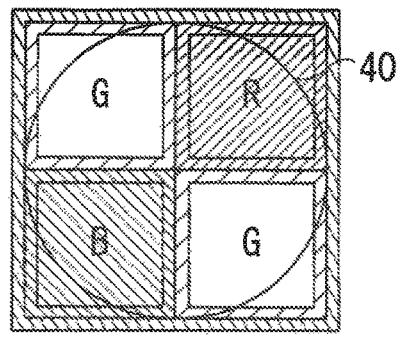
INCIDENCE PLANE OF LIGHT
(a)
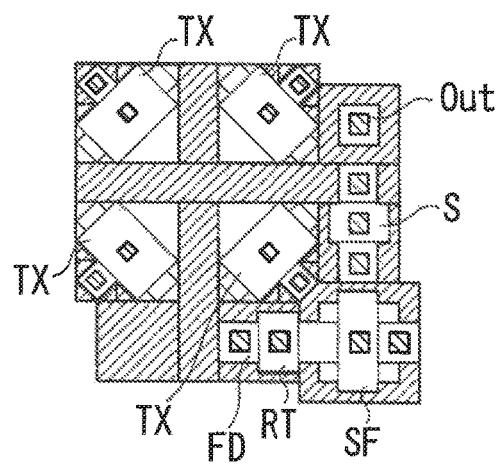
WIRING DIAGRAM
(b)

IMAGE SENSOR AND IMAGE-CAPTURING DEVICE

This application is a Continuation Application of U.S. patent application Ser. No. 14/389,458, filed Sep. 30, 2014, which in turn is a National Phase Application of PCT/JP2013/059622, filed Mar. 29, 2013, which in turn claims priority from Japanese Application No. 2012-081167, filed Mar. 30, 2012. The disclosures of the prior applications are hereby incorporated by reference herein in their entirety.

TECHNICAL FIELD

The present invention relates to an image sensor, a photographing method and an image-capturing device.

BACKGROUND ART

An image-capturing device is known which performs focus detection by a split-pupil phase detection method on the basis of output signals from a plurality of pixels dedicated for focus detection arranged on a part of an image sensor (see Patent literature 1).

CITATION LIST

Patent Literature

Patent literature 1: Japanese Patent Application Laid-open No. 2007-282109.

SUMMARY OF INVENTION

Technical Problem

To perform focus detection by the conventional art, the focus detection is possible only at positions where pixels dedicated for focus detection are arranged. However, an increased number of pixels dedicated for focus detection results in a decrease in image quality since no image signal is obtained from the positions where the pixels dedicated for focus detection are arranged. As described above, according to the conventional technology, it is made possible to perform focus detection by a phase detection method as well as generation of image signals based upon output signals from image sensor. On the other hand, there occurs an adverse effect due to provision of the pixels dedicated for focus detection at a part of the image sensor.

Solution to Problem

According to the 1st aspect of the present invention, an image sensor comprises: a plurality of microlenses arranged in a two-dimensional pattern; and a plurality of pixels that are provided in correspondence to each of the microlenses and receive lights of different color components, respectively. Pixels that are provided at adjacent microlenses among the microlenses and that receive lights of same color components, are adjacently arranged.

According to the 2nd aspect of the present invention, in the image sensor according to the 1st aspect, it is preferred that signals from the pixels are used both for focus detection and for generation of image data.

According to the 3rd aspect of the present invention, an image sensor comprises: a plurality of microlenses arranged in a two-dimensional pattern; and a plurality of pixels that are arranged in correspondence to each of the microlenses and receive lights having different color components, respectively. Signals from the pixels are used both for focus detection and for generation of image data.

According to the 4th aspect of the present invention, a photographing method comprises: a focus detection step for performing focus detection, by using signals from particular pixels in an image sensor including a plurality of microlenses arranged in a two-dimensional pattern and a plurality of pixels that are arranged in correspondence to each of the microlenses and receive lights having different color components, the particular pixels receiving lights of same color components from different microlenses, respectively; and a shooting step for generating a capture image by using signals from plurality of pixels provided in correspondence to each of the microlenses, the plurality of pixels receiving lights of different color components.

According to the 5th aspect of the present invention, in the photographing method according to the 4th aspect, it is preferred that, in the image sensor, pixels are provided at adjacent microlenses among the microlenses and that receive lights of same color components are adjacently arranged.

According to the 6th aspect of the present invention, an image-capturing device comprises: an image sensor that captures an image of a subject with light fluxes from the subject that have passed through an imaging optical system; an image generation unit that generates an image signal based upon an output signal from the image sensor; and a focus detection unit that detects a focusing condition of the imaging optical system by a phase detection method based upon an output signal from the image sensor. The image sensor includes a pixel group and a microlens group arranged so as to guide the light fluxes from the subject to the pixel group. The pixel group includes first, second and third pixels having first, second and third spectral sensitivities, respectively, differing from each other, and being arranged in a two-dimensional pattern, with one of the first pixels, one of the second pixels and two of the third pixels being arranged in a two-by-two matrix behind each microlens in the microlens group, and the four pixels receive four light fluxes, respectively, that pass through four pupil areas, respectively, of an exit pupil of the imaging optical system. The first, second, and third pixels are arranged such that pixels having substantially same spectral sensitivities are adjacently arranged in a two-by-two matrix and four pixels adjacent to the two-by-two matrix are arranged behind four different microlenses in the microlens group, respectively, and at different positions with respect to the microlenses. The image generation unit generates the image signal based upon output signals from the first, second and third pixels. The focus detection unit detects the focusing condition based upon an output signal from at least one of the first, second, and third pixels.

According to the 7th aspect of the present invention, in the image-capturing device according to the 6th aspect, it is preferred that the first pixel has a red color filter, the second pixel has a blue color filter, and the third pixel has a green color filter.

According to the 8th aspect of the present invention, in the image-capturing device according to the 7th aspect, it is preferred that the pixel group includes an array of a plurality of sets of pixels arranged in a two-dimensional pattern, each of the plurality of sets of pixels having four pixels arranged in a two-by-two matrix behind any particular one of the microlenses and the sets include first through fourth sets having different arrangements of pixels, in the first set, the first pixel and the third pixel are adjacently arranged in a predetermined array direction and the third pixel and the second pixel are arranged adjacent to the first pixel and the third pixel, respectively, in a direction perpendicular to the predetermined array direction, in the second set, the third pixel and the first pixel are adjacently arranged in the predetermined array direction and the second pixel and the third pixel are arranged adjacent to the third pixel and the first pixel, respectively, in the direction perpendicular to the predetermined array direction, in the third set, the third pixel and the second pixel are adjacently arranged in the predetermined array direction and the first pixel and the third pixel are arranged adjacent to the third pixel and the second pixel, respectively, in the direction perpendicular to the predetermined array direction, in the fourth set, the second pixel and the third pixel are adjacently arranged in the predetermined array direction and the third pixel and the first pixel are arranged adjacent to the second pixel and the third pixel, respectively, in the direction perpendicular to the predetermined array direction, the first set and the second set are adjacent to each other in the predetermined array direction and alternately arranged in a repeated manner in the predetermined array direction, the third set and the fourth set are adjacent to each other in the predetermined array direction and alternately arranged in a repeated manner in the predetermined array direction, a first row formed by the first set and the second set and a second row formed by the third set and the fourth set are adjacent to each other in the direction perpendicular to the predetermined array direction and alternately arranged in a repeated manner in the direction perpendicular to the predetermined array direction.

According to the 9th aspect of the present invention, in the image-capturing device according to the 7th or the 8th aspect, it is preferred that the image generation unit adds output signals from four of the first pixels that are adjacent to each other in a form of a two-by-two matrix, adds output signals from four of the second pixels that are adjacent to each other in a form of a two-by-two matrix, and adds output signals from four of the third pixels that are adjacent to each other in a form of a two-by-two matrix to generate an image signal of a Bayer arrangement.

According to the 10th aspect of the present invention, in the image-capturing device according to any one of the 6th through 8th aspects, it is preferred that the image generation unit obtains three color signals at a position corresponding to each microlens based upon output signals from the first, second and third pixels arranged behind each microlens.

According to the 11th aspect of the present invention, in the image-capturing device according to any one of the 6th through 8th aspects, it is preferred that the image generation unit performs, at respective positions of the first through third pixels, color interpolation processing for generating signals of other two spectral components to obtain three color signals and generates a luminance signal and color difference signals based on the thus obtained three color signals.

According to the 12th aspect of the present invention, in the image-capturing device according to any one of the 6th through 11th aspects, it is preferred that the focus detection unit detects the focusing condition of the imaging optical system based upon output signals from a pair of pixels having substantially same spectral sensitivities and located at positions differing from each other with respect to the microlens, out of the pixel group.

According to the 13th aspect of the present invention, in the image-capturing device according to the 8th aspect, it is preferred that the focus detection unit detects the focusing condition of the imaging optical system in the predetermined array direction based upon output signals from at least one plurality of the third pixels of a plurality of the third pixels contained in the first set and the second set, respectively, and a plurality of the third pixels contained in the third set and the fourth set, respectively.

According to the 14th aspect of the present invention, in the image-capturing device according to the 8th aspect, it is preferred that the focus detection unit detects the focusing condition of the imaging optical system in the direction perpendicular to the predetermined array direction based upon output signals from at least one plurality of the third pixels of a plurality of the third pixels contained in the first set and the third set, respectively, and a plurality of the third pixels contained in the second set and the fourth set, respectively.

According to the 15th aspect of the present invention, in the image-capturing device according to the 8th aspect, it is preferred that the focus detection unit detects the focusing condition of the imaging optical system in a direction oblique to the predetermined array direction based upon output signals from at least one plurality of the third pixels of a plurality of the third pixels contained in the first set and the fourth set, respectively, and a plurality of the third pixels contained in the second set and the third set, respectively.

According to the 16th aspect of the present invention, an image sensor comprises: a pixel group; and a microlens group arranged so as to guide the subject light fluxes to the pixel group. The pixel group includes first, second and third pixels having first, second and third spectral sensitivities, respectively, differing from each other, and being arranged in a two-dimensional pattern, with one of the first pixels, one of the second pixels and two of the third pixels being arranged in a two-by-two matrix behind each microlens in the microlens group, and the four pixels receive four light fluxes, respectively, that pass through four pupil areas, respectively, of an exit pupil of an imaging optical system. The first, second, and third pixels are arranged such that pixels having substantially same spectral sensitivities are adjacently arranged in a two-by-two matrix, respectively, and four pixels adjacent to the two-by-two matrix are arranged behind four different microlenses of the microlens group, respectively, and at different positions with respect to the microlenses.

Advantageous Effect of Invention

According to the present invention, image signal generation and focus detection by a phase detection method can be performed based upon output signals from the image sensor without providing the image sensor with pixels dedicated for focus detection.

BRIEF DESCRIPTION OF DRAWINGS

FIG. 2 A plan view illustrating by an example a layout of pixels in an image sensor.

FIG. 12 A diagram illustrating third image signal generation processing.

FIG. 14 A diagram illustrating third image signal generation processing.

FIG. 15 A diagram illustrating third image signal generation processing.

FIG. 16 A diagram illustrating third image signal generation processing.

FIG. 18 A diagram illustrating image signal generation processing according to Variation Example 6.

FIG. 20 A plan view illustrating by an example a layout of circuitry in an image sensor.

FIG. 21 (a) A diagram illustrating by an example an incidence plane of an image sensor, (b) a diagram illustrating by an example a wiring plane of an image sensor.

DESCRIPTION OF EMBODIMENTS

Figure 1:
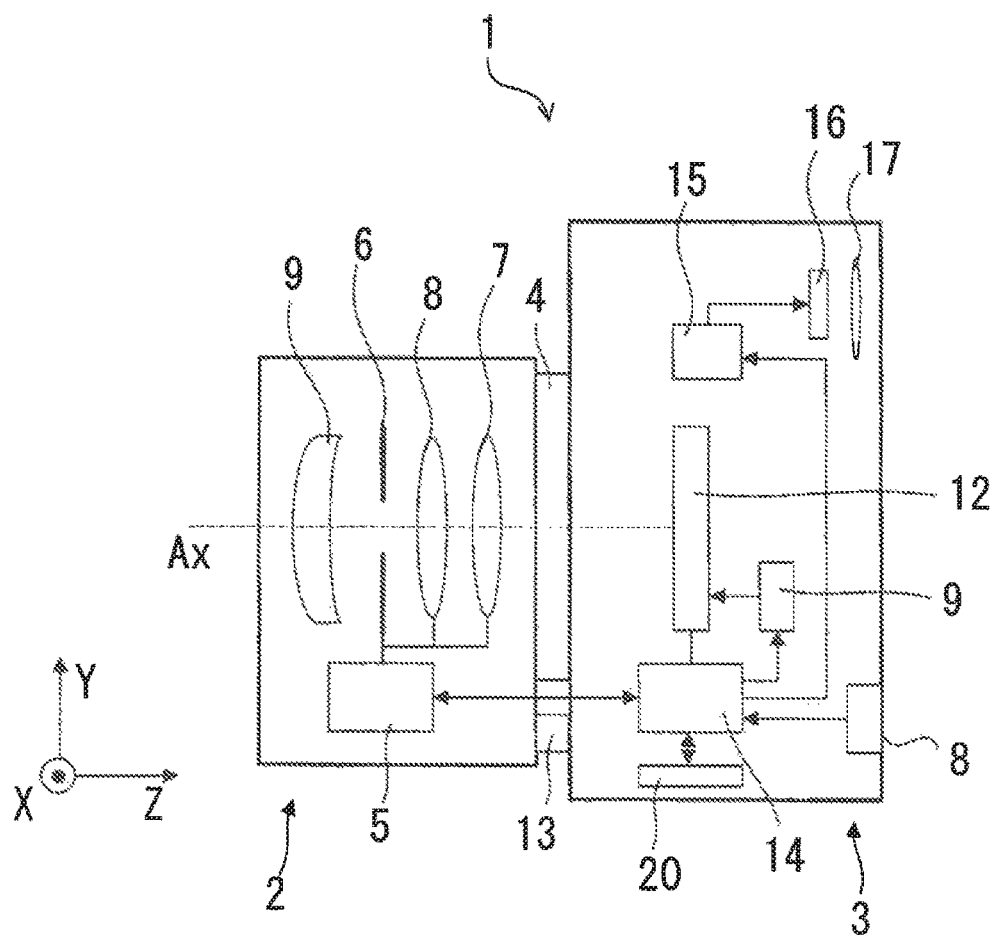
FIG. 1 A diagram illustrating by an example a configuration of a digital camera according to an embodiment of the present invention.

Hereinafter, an embodiment of the present invention is described with reference to the attached drawings. FIG. 1 presents a diagram illustrating by an example the configuration of a digital camera according to an embodiment of the present invention. A digital camera 1 includes an interchangeable lens 2 and a camera body 3. The interchangeable lens 2 is mounted on the camera body 3 via a mount unit 4.

The interchangeable lens 2 includes a lens control unit 5, a main lens 9, a zoom lens 8, a focusing lens 7, and a diaphragm 6. The lens control unit 5 includes a microcomputer, a memory and so on and performs drive control of the focusing lens 7 and the diaphragm 6, detection of an open state of the diaphragm 6, detection of positions of the zoom lens 8 and the focusing lens 7, transmission of information about lens to a body control unit 14 on the side of the camera body 3 described later, reception of information about camera from the body control unit 14, and so on.

The camera body 3 includes an image sensor 12, an image sensor drive control unit 19, the body control unit 14, a liquid crystal display element drive circuit 15, a liquid crystal display element 16, an ocular lens 17, an operating member 18 and so on. A detachable memory card 20 is attached to the camera body 3. The image sensor 12 is arranged on a predetermined imaging plane of the interchangeable lens 2 and captures an image of a photographic subject that is formed by the interchangeable lens 2.

The body control unit 14 includes a microcomputer, a memory and so on. The body control unit 14 controls operations of the digital camera in whole. The body control unit 14 and the lens control unit 5 are configured to communicate with each other via an electric contact unit 13 of the mount unit 4.

The image sensor drive control unit 19 generates a control signal that is necessary for the image sensor 12 in response to a command from the body control unit 14. The liquid crystal display element drive circuit 15 drives the liquid crystal display element 16 that constitutes a liquid crystal view finder (EVF: electric view finder) in response to a command from the body control unit 14. The photographer observes an image displayed on the liquid crystal display element 16 through the ocular lens 17. The memory card 20 is a storage medium in which image data and the like are stored.

The image of the photographic subject formed in the image sensor 12 by the interchangeable lens 2 is subjected to photoelectric conversion by the image sensor 12. The image sensor 12 is controlled by a control signal from the image sensor drive control unit 19 with respect to timing (frame rate) of storage of photoelectric conversion signals and reading of signals. The output signal from the image sensor 12 is converted in an A/D conversion unit (not shown) into digital data and the obtained digital data is transmitted to the body control unit 14.

The body control unit 14 calculates a defocus amount on the basis of output signals from the image sensor 12 corresponding to predetermined focus detection areas and transmits the calculated defocus amount to the lens control unit 5. The lens control unit 5 calculates a focusing lens drive amount on the basis of the defocus amount received from the body control unit 14 and drives the focusing lens 7 by a motor or the like, which is not shown, to move it to a focusing position on the basis of the calculated lens drive amount.

The body control unit 14 generates image data to be recorded on the basis of a signal that is output from the image sensor 12 after shooting is commanded. The body control unit 14 stores the generated image data in the memory card 20 and at the same time transmits the generated image data to the liquid crystal display element drive circuit 15 and controls it to be reproduced and displayed on the liquid crystal display element 16.

It is to be noted that the camera body 3 is provided with the operating member 18 that includes a shutter button and a setting member for setting a focus detection area or areas and so on. The body control unit 14 detects an operating signal from the operating member 18 and controls the operations (photographing processing, setting of a focus detection area and so on) in response to the result of the detection.

<Description of Image Sensor>

Since the present embodiment is featured by the image sensor 12, further description is focused on the image sensor 12. FIGS. 2(a) and (b) presents plan views each illustrate by an example the layout of pixels in the image sensor 12. In this case, 10×10 pixels, which are extracted from the pixels in the image sensor 12 as representatives, are shown. The extracted pixels are laid out in a substantially square form and arranged in a two-dimensional pattern. The extracted pixels include three types of pixels, i.e., a pixel that receives light of a red color component (R pixel), a pixel that receives light of a green color component (G pixel), and a pixel that receives light of a blue color component (B pixel).

The R pixel includes a color filter that is transmissive to only the light of the red color component and a photoelectric conversion unit arranged behind this color filter. The G pixel includes a color filter that is transmissive to only the light of the green color component and a photoelectric conversion unit arranged behind this color filter. The B pixel is constituted by a color filter that is transmissive to only the light of the blue color component and a photoelectric conversion unit arranged behind this color filter.

In addition, the image sensor 12 is formed of a plurality of microlenses 40 each of which efficiently guides light fluxes from the interchangeable lens 2 to a set of four pixels. In FIG. 2, 5×5=25 circles correspond to the microlenses 40. The microlenses 40, each constituted by a spherical lens of axial symmetry whose center substantially coincides with its optical axis or a nonspherical lens, are arranged in a two-dimensional pattern, with the light incident side thereof having a convex shape.

Behind each of the microlenses 40, one R pixel, two G pixels and one B pixel are arranged in a two-by-two matrix. In the present invention, as shown in FIG. 2(*a*), a plurality of sets of four pixels positioned behind the corresponding microlenses 40, respectively, are classified into four types (P1 through P4) according to differences in their arrangements.

Behind the microlenses 40, first sets P1 each include an R pixel at a left upper position, a G pixel at a right upper position, a G pixel at a left lower position, and a B pixel at a right lower position. Second sets P2 each include a G pixel at a left upper position, an R pixel at a right upper position, a B pixel at a left lower position, and a G pixel at a right lower position. Third sets P3 each include a G pixel at a left upper position, a B pixel at a right upper position, an R pixel at a left lower position, and a G pixel at a right lower position. Fourth sets P4 each include a B pixel at a left upper position, a G pixel at a right upper position, a G pixel at a left lower position, and an R pixel at a right lower position.

The first sets P1 and the second sets P2 are adjacent to each other in a horizontal direction (X direction) and arranged alternately in a repeated manner in the horizontal direction. A line formed by the first sets P1 and the second sets P2 is called a "first line L1". The third sets P3 and the fourth sets P4 are adjacent to each other in the horizontal direction and are arranged alternately in a repeated manner in the horizontal direction. A line formed by the third sets P3 and the fourth sets P4 is called a "second line L2".

The first line L1 and the second line L2 described above are adjacent to each other in a vertical direction (Y direction) and are alternately arranged in a repeated manner in the vertical direction. With this configuration, each of the first sets P1 and each of the third sets P3 are adjacent to each other in the vertical direction, whereas each of the second sets P2 and each of the fourth sets P4 are adjacent to each other in the vertical direction.

With such an arrangement, the microlenses 40 and the R pixels, the G pixels, and the B pixels have the following positional relationships.

First, the R pixels, behind four microlenses 40 adjacent to each other in the horizontal direction and in the vertical direction, are arranged at a left upper position, a right upper position, a left lower position, and a right lower position, respectively. The G pixels, behind four microlenses 40 adjacent to each other in the horizontal direction and in the vertical direction, are arranged at right upper and left lower positions, left upper and right lower positions, left upper and right lower positions, and right upper and left lower positions, respectively. The B pixels, behind four microlenses 40 adjacent to each other in the horizontal direction and in the vertical direction, are arranged at a right lower position, a left lower position, a right upper position, and a left upper position, respectively. In this manner, the R pixels, the G pixels, and the B pixels are uniformly arranged behind the microlenses 40 without being arranged disproportionately to specific positions.

FIG. 2(*b*) is a diagram showing an extracted part similar to that shown in FIG. 2(*a*). When four sets of pixels (P1 through P4) shown in FIG. 2(*a*) are viewed by shifting them by 1 pixel both in the horizontal direction and in the vertical direction, the R, G and B pixels each are arranged such that adjacent four pixels in a two-by-two matrix have the same color as shown in FIG. 2(*b*).

In addition, the four pixels in a two-by-two matrix having the same color are arranged behind different microlenses 40, respectively, so that they assume different positions with respect to the microlenses 40. In other words, the R, G and B pixels arranged behind the microlenses 40, respectively, are arranged such that they are adjacent to each other in a two-by-two matrix for each color.

The sets constituted by four pixels in a two-by-two matrix of the same color, i.e., a set 50*r* constituted by four R pixels, a set 50*g* constituted by four G pixels, and a set 50*b* constituted by four B pixels, when the four pixels are viewed as one set, each form a Bayer arrangement.

<Focus Detection Processing>

Figure 3:
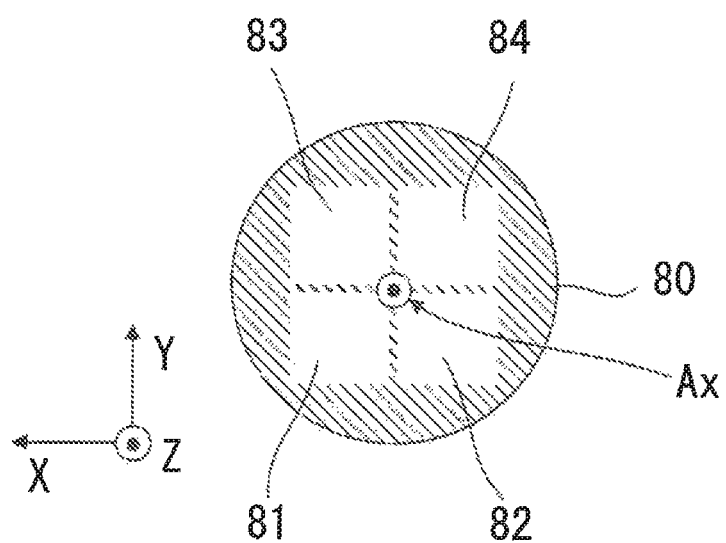
FIG. 3 A diagram illustrating by an example an exit pupil of an interchangeable lens.

Next, an example in which signals for focus detection are obtained from the image sensor 12 having the configuration described above is described referring to FIG. 3 through FIG. 9. FIG. 3 presents a diagram illustrating by an example an exit pupil 80 of the interchangeable lens 2 in a state in which the diaphragm is open. Light fluxes that have passed through four regions 81 through 84 of the exit pupil 80 enter pixels located at positions corresponding to a left upper part, a right upper part, a left lower part, and a right lower part, respectively, of each of the microlenses 40 in FIG. 2. For each of the microlenses 40, correspondence relationship between the light fluxes that enter the pixels located at positions corresponding to the left upper, right upper, left lower, and right lower parts of the microlens and the first region 81, the second region 82, the third region 83, and the fourth region 84, respectively, of the exit pupil 80 may be considered such that the up and down relation as well as the left and right relation are inverted with respect to the light axis Ax of the interchangeable lens 2 as an axis of symmetry. It is to be noted that FIG. 3 presents a diagram illustrating a concept. Actually, a configuration is adopted such that the light that has passed through each of the microlenses 40 is prevented from entering pixels included in an adjacent set so that there will occur no color contamination or no decrease in resolution and the like.

Figure 4:
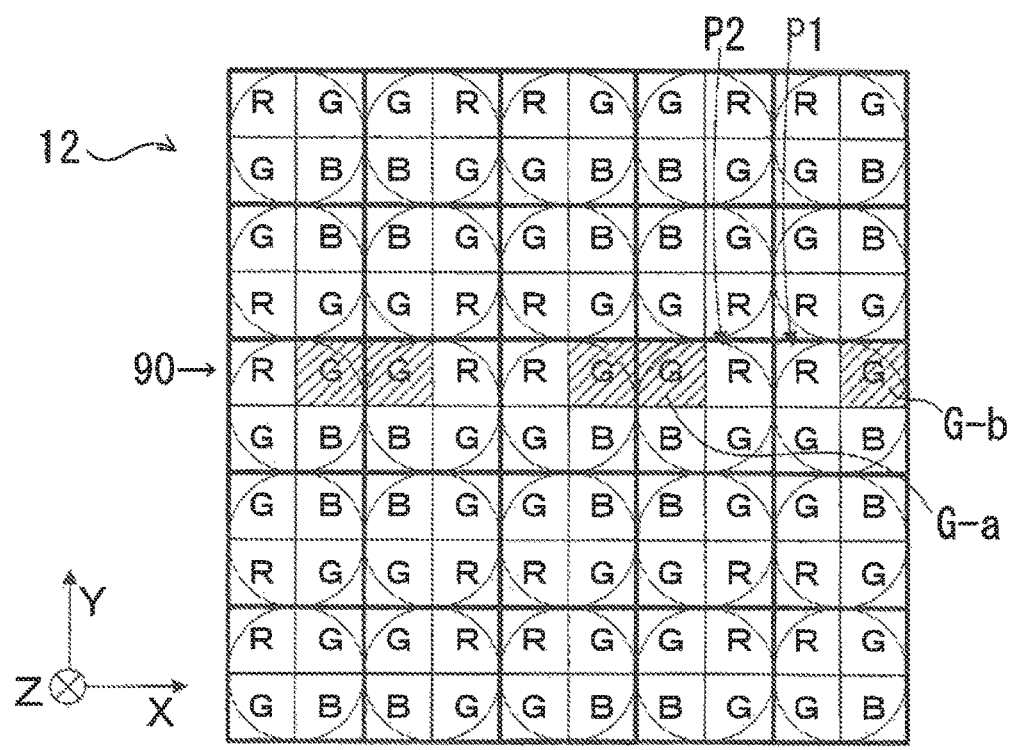
FIG. 4 A diagram illustrating pixel rows for obtaining a defocus amount.
Figure 5:
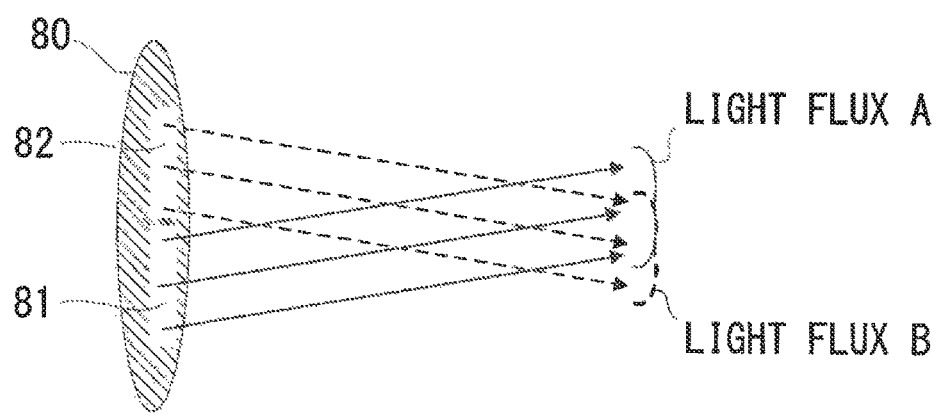
FIG. 5 A diagram illustrating light fluxes passing through an exit pupil.

First, as exemplified in FIG. 4, explanation is made on a case in which the defocus amount is obtained based on a pixel row 90, in which G pixels out of the pixels in the image sensor 12 are arranged in the horizontal direction (X axis direction). The pixel row 90 is constituted by a G pixel included in the second set P2 and located at the left upper position of the microlens 40 (G-a) and a G pixel included in the first set P1 and located at the right upper position of the microlens 40 (G-b). As exemplified in FIG. 5, a light flux A that passes through a first region 81 on the exit pupil 80 and a light flux B that passes through a second region 82 on the exit pupil 80 enter the pixels that constitute the pixel row 90. The light flux A enters the G pixel (G-a) located at the left upper position of the microlens 40. The light flux B enters the G pixel (G-b) located at the right upper position of the microlens 40.

Upon focusing, the image sensor 12 is in a state in which a sharp image is formed, so that as described above, a pair of images formed by light fluxes through different positions of the pupil as a result of pupil-splitting coincide with each other on the image sensor 12. In other words, in the pixel row 90, a signal waveform (signal sequence a1, a2, a3, a4, . . . ) obtained from the G pixels (G-a) that receive the light fluxes A and a signal waveform (signal sequence b1, b2, b3, b4, . . . ) obtained from the G pixels (G-b) that receive the light fluxes B overlap in their shape.

On the other hand, upon non-focusing, i.e., in a state in which a sharp image is formed on the front side or on the rear side of the image sensor 12, a pair of images formed by the light fluxes subjected to the pupil-splitting do not overlap with each other on the image sensor 12. In this case, the signal waveform (signal sequence a1, a2, a3, a4 . . . ) by the light fluxes A and the signal waveform (signal sequence b1, b2, b3, b4, . . . ) by the light fluxes B have different positional relationships (deviation direction and deviation amount) therebetween according to a deviation (a defocus amount) from the focused state.

The body control unit 14 calculates the focusing condition (defocus amount) of the focus position by the interchangeable lens 2 on the basis of the positional relationship between the signal waveform (signal sequence a1, a2, a3, a4 . . . ) by the light fluxes A and the signal waveform (signal sequence b1, b2, b3, b4, . . . ) by the light fluxes B and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

Figure 6:
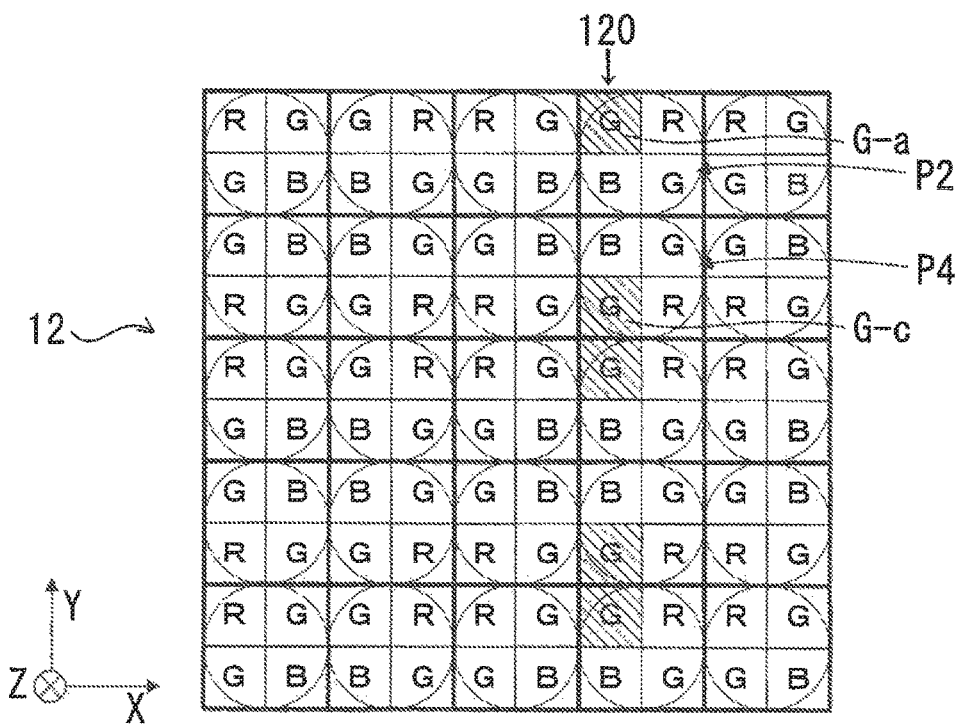
FIG. 6 A diagram illustrating pixel rows for obtaining a defocus amount.
Figure 7:
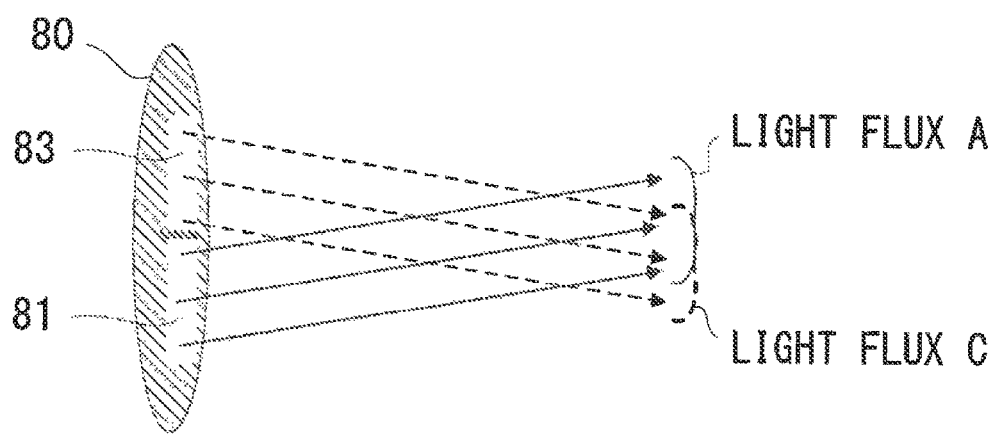
FIG. 7 A diagram illustrating light fluxes passing through an exit pupil.

Next, explanation is made on a case in which the defocus amount is obtained 20o based upon a pixel row 120 in which G pixels out of the pixels in the image sensor 12 are arranged in the vertical direction (Y axis direction) as exemplified in FIG. 6. The pixel row 120 is constituted by a G pixel (G-a) that is included by the second set P2 and located at a position corresponding to the left upper part of the corresponding microlens 40 and a G pixel (G-c) that is included by the fourth set P4 and located at a position corresponding to the left lower part of the corresponding microlens 40. As shown in FIG. 7, the light flux A that passes through the first region 81 on the exit pupil 80 and a light flux C that passes through a third region 83 on the exit pupil 80 enter the pixels that constitute the pixel row 120. The light flux A enters the G pixel (G-a) located at a position corresponding to the left upper part of the corresponding microlens 40. The light flux C enters the G pixel (G-c) located at a position corresponding to the left lower part of the corresponding microlens 40.

Upon focusing, the image sensor 12 is in a state in which a sharp image is formed therein, so that in the pixel row 120 as described above, a signal waveform (signal sequence a1, a2, a3, a4, . . . ) obtained from the G pixels (G-a) that receive the light fluxes A and a signal waveform (signal sequence c1, c2, c3, c4, . . . ) obtained from the G pixels (G-c) that receive the light fluxes C overlap in their shape.

On the other hand, upon non-focusing, the signal waveform (signal sequence a1, a2, a3, a4 . . . ) by the light fluxes A and the signal waveform (signal sequence c1, c2, c3, c4, . . . ) by the light fluxes C have positional relationships (deviation direction and deviation amount) therebetween which are different from each other according to a deviation (a defocus amount) from the focused state.

The body control unit 14 calculates the focusing condition (defocus amount) at the focus position by the interchangeable lens 2 on the basis of the positional relationships between the signal waveform (signal sequence a1, a2, a3, a4 . . . ) by the light fluxes A and the signal waveform (signal sequence c1, c2, c3, c4, . . . ) by the light fluxes C and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

Figure 8:
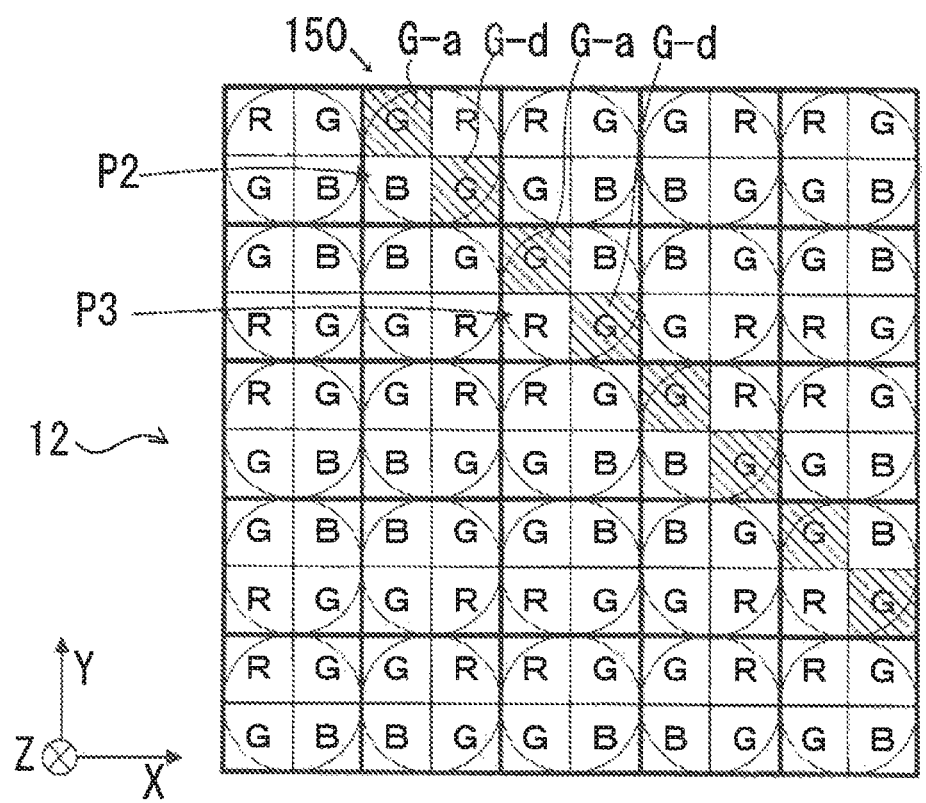
FIG. 8 A diagram illustrating pixel rows for obtaining a defocus amount.
Figure 9:
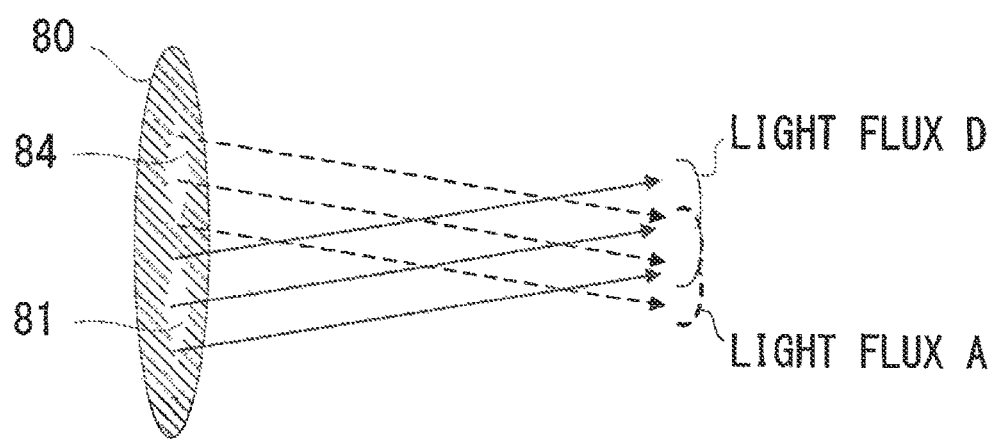
FIG. 9 A diagram illustrating light fluxes passing through an exit pupil.

In addition, explanation is made on a case in which the defocus amount is obtained on the basis of a pixel row 150 that is constituted by G pixels out of the pixels in the image sensor 12 are arranged in an oblique direction as exemplified in FIG. 8. The pixel row 150 is constituted by a G pixel (G-a) included in the second set P2 and located at a position corresponding to the left upper part of the corresponding microlens 40, a G pixel (G-d) included in the second set P2 and located at a position corresponding to the right lower part of the corresponding microlens 40, a G pixel (G-a) included in the third set P3 and located at a position corresponding to the left upper part of the corresponding microlens 40, and a G pixel (G-d) included in the third set P3 and located at a position corresponding to the right lower part of the corresponding microlens 40. As shown in FIG. 9, the light flux A that passes through the first region 81 on the exit pupil 80 and a light flux D that passes through a fourth region 84 on the exit pupil 80 enter the pixels that constitute the pixel row 150. The light flux A enters the G pixel (G-a) located at a position corresponding to the left upper part of the corresponding microlens 40. The light flux D enters the G pixel (G-d) located at a position corresponding to the right lower part of the corresponding microlens 40.

Upon focusing, the image sensor 12 is in a state in which a sharp image can be formed therein, so that in the pixel row 150 as described, a signal waveform (signal sequence a1, a2, a3, a4, . . . ) obtained from the G pixels (G-a) that receive the light fluxes A and a signal waveform (signal sequence c1, c2, c3, c4, . . . ) obtained from the G pixels (G-c) that receive the light fluxes C overlap in their shape.

On the other hand, upon non-focusing, the signal waveform (signal sequence a1, a2, a3, a4 . . . ) by the light fluxes A and the signal waveform (signal sequence d1, d2, d3, d4, . . . ) by the light fluxes D have positional relationship (deviation direction and deviation amount) therebetween, which are different from each other, according to the deviation (defocus amount) from the focused state.

The body control unit 14 calculates the focusing condition (defocus amount) of the focus position by the interchangeable lens 2 on the basis of the positional relationship between the signal waveform (signal sequence a1, a2, a3, a4 . . . ) by the light fluxes A and the signal waveform (signal sequence d1, d2, d3, d4, . . . ) by the light fluxes D and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

<Image Signal Generation Processing>

Next, explanation is made on an example in which image signals are obtained from the image sensor 12 referring to FIG. 10 through FIG. 16. In the present embodiment, any of the following three methods is used as image signal generation processing for generating a color image signal on the basis of output signals from the image sensor 12. The body control unit 14 executes image signal generation processing by a method indicated by an initial setting in advance.

(First Image Signal Generation Processing)

Figure 10:
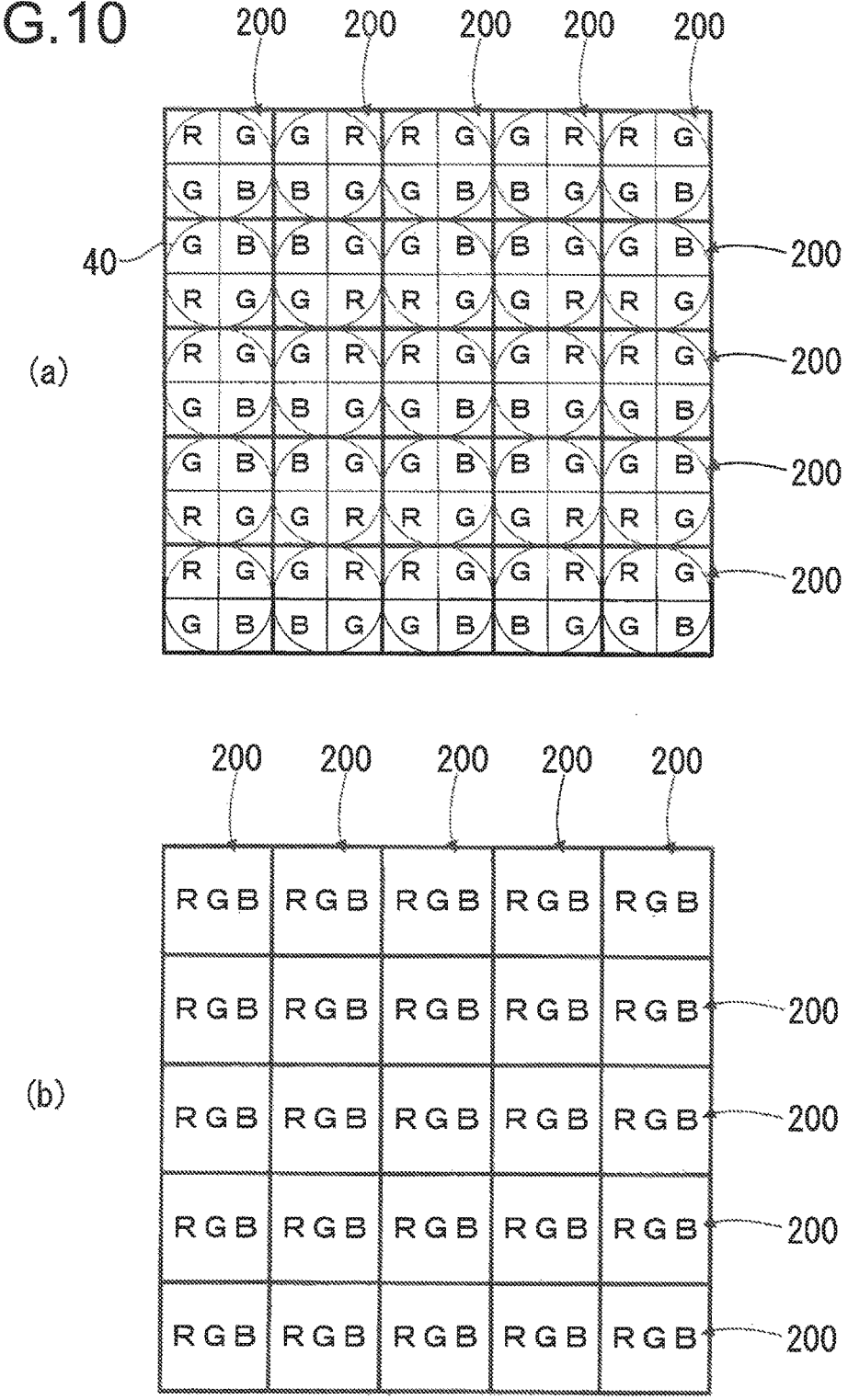
FIG. 10 A diagram illustrating first image signal generation processing.

FIG. 10 presents a diagram illustrating first image signal generation processing. The body control unit 14 that executes the first image signal generation processing treats four pixels that receive light fluxes through the one and the same microlens 40 as one set 200 as shown in FIG. 10(*a*). Each set 200 includes two G pixels, one B pixel and one R pixel.

The body control unit 14 treats, for each set 200, an output signal from the R pixel as an R image signal of the set 200, an output signal from the B pixel as a B image signal of the set 200, and an average value of output signals from the two G pixels as a G image signal of the set 200. As a result, the body control unit 14 can obtain color image signals (RGB) in a number that is ¼ times the number of the pixels included by the image sensor 12 as shown in FIG. 10(*b*). The body control unit 14 generates an image file for recording by using the thus-obtained color image signals.

As described above, in the first image signal generation processing, color image signals can be obtained without performing color interpolation processing for interpolating color signals.

(Second Image Signal Generation Processing)

Figure 11:
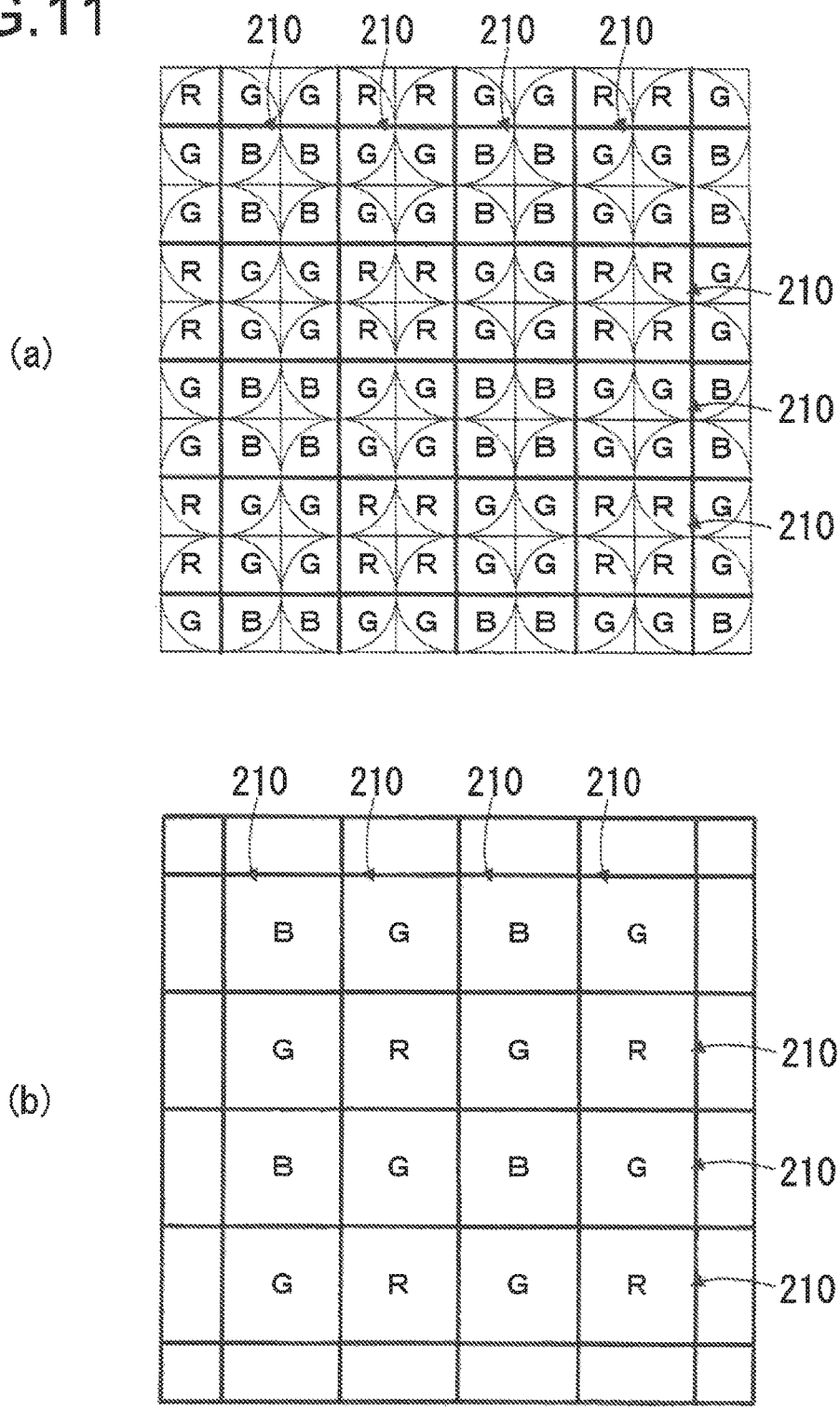
FIG. 11 A diagram illustrating second image signal generation processing.

FIG. 11 presents a diagram illustrating second image signal generation processing. The body control unit 14 that executes the second image signal generation processing treats adjacent four pixels in a two-by-two matrix having the same color as one set 210 as shown in FIG. 11(*a*).

The body control unit 14 treats a signal obtained by adding output signals from the four pixels included in any particular one of the set 120 as an image signal of the particular set 210. Specifically, in the case of any particular one set 210 all constituted by R pixels, the body control unit 14 treats a signal obtained by adding output signals from the four R pixels as an R image signal of the particular one set 210. In the case of any particular one set 210 all constituted by G pixels, the body control unit 14 treats a signal obtained by adding output signals from the four G pixels as a G image signal of the particular one set 210. In the case of any particular one set 210 all constituted by B pixels, the body control unit 14 treats a signal obtained by adding output signals from the four B pixels as a B image signal of the particular one set 210. As a result, the body control unit 14 can obtain color image signals of a Bayer arrangement in a number that is ¼ times the number of the pixels included by the image sensor 12 as shown in FIG. 11(*b*).

And now, depending on the angle of incidence of the light fluxes that enter the microlens 40 it may happen that the four pixels arranged behind the microlens 40 receive uneven amounts of light. For instance, at a certain incident angle θ1, the amount of light received by the pixel located at a position corresponding to the left upper part of the corresponding microlens 40 is relatively large while the amount of light received by the pixel located at a position corresponding to the right lower part of the corresponding microlens 40 is relatively small. At another incident angle θ2, the amount of light received by the pixel located at a position corresponding to the left upper part of the corresponding microlens 40 is relatively small while the amount of light received by the pixel located at a position corresponding to the right lower part of the corresponding microlens 40 is relatively large.

In the second image signal generation processing, as a signal obtained by adding output signals from four pixels located at positions corresponding to different parts (left upper, right upper, left lower, and right lower parts) of the corresponding microlens 40 (that is, four pixels included by any particular one set 210) is treated as an image signal of the particular one set 210, an optimal image signal can be generated independently of the incident angle of the light fluxes that enter the microlens 40.

In addition, the body control unit 14 generates, in an image signal of a Bayer arrangement in any particular one set 210, a color component that is in short by interpolation processing using signals from sets 210 adjacent to the particular one set 210. For instance, in the case of any particular one set 210 all constituted by G pixels, as there is present neither R image signal nor B image signal therefrom, color interpolation processing is executed by using signals from sets 210 circumjacent to the particular one set 210. Since such color interpolation processing in the Bayer arrangement is known, detailed description thereof is omitted herein. The body control unit 14 generates a file for recording by using color image signals (RGB) obtained by executing this color interpolation processing.

(Third Image Signal Generation Processing)

The body control unit 14 that executes third signal generation processing first executes color interpolation processing for interpolating a color component that is in short in each pixel.

FIG. 12 presents a diagram illustrating processing for interpolating a G image signal. The body control unit 14 generates, at a position of any particular one of the R pixels and the B pixels, a G image signal by using output signals from four G pixels located nearest to the particular one pixel by interpolation processing. For instance, in case that a G image signal is to be interpolated at the position of the R pixel in a thick-frame in FIG. 12(*a*), output signals from four G pixels (G1 through G4) that are located nearest to this particular R pixel are used. The body control unit 14 defines $(\alpha G1+\beta G2+\gamma G3+\delta G4)/4$ as a G image signal of the particular R pixel. It is to be noted that $\alpha$ through $\delta$ each are coefficients according to the distances from the particular R pixel. The smaller the distance from the particular R pixel, the greater the coefficient is. In this case, as the G pixels G1 and G2 are closer to the particular R pixel than the G pixels G3 and G4 are, it is set that $\alpha=\beta>\gamma=\delta$.

In this manner, the body control unit 14 executes processing for interpolating G image signals at positions of R pixels and B pixels, so that a G image signal can be obtained at a position of each pixel 30 as shown in FIG. 12(*b*).

Figure 13:
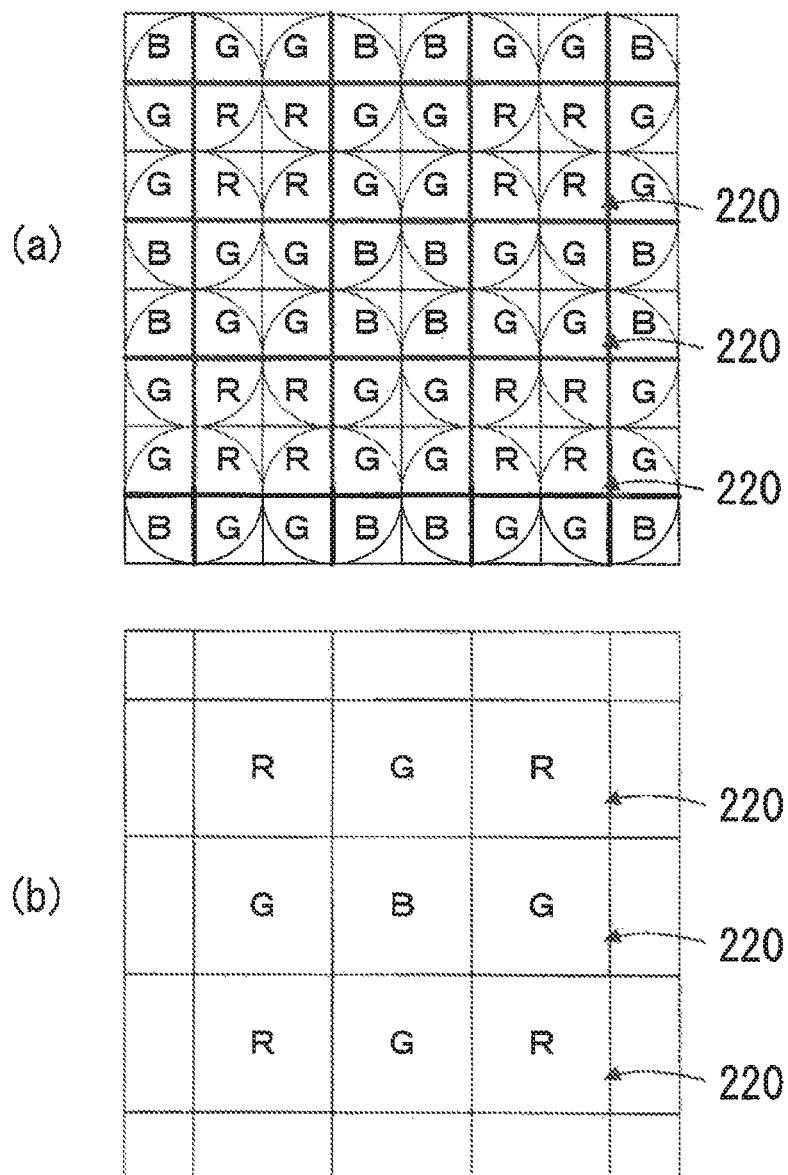
FIG. 13 A diagram illustrating third image signal generation processing.

FIG. 13 presents a diagram illustrating processing for interpolating R image signals and B image signals. The body control unit 14 treats four pixels constituted by adjacent four pixels in a two-by-two matrix having the same color as one set 220 and a signal obtained by adding output signals from the four pixels is defined to be an image signal of the set 220 as shown in FIG. 13(*a*). The sets 220 each form a Bayer arrangement as shown in FIG. 13(*b*). The body control unit 14 executes interpolation processing for interpolating an R image signal and a B image signal in each of the sets 220 by using conventional color interpolation processing for Bayer arrangements. As a result of this interpolation processing, an R image signal is obtained in each set 220 as shown in FIG. 14(*a*) and a B image signal is obtained in each set 220 as shown in FIG. 15(*a*).

The body control unit 14 converts resolution by defining a signal obtained by dividing the interpolated image signal in each set 220 by 4 (R/4) as an R image signal of the four pixels that constitute each set 220. As a result, the body control unit 14 can obtain an R image signal at a position of each pixel 30 as shown in FIG. 14(*b*). Similarly, the body control unit 14 converts resolution by defining a signal obtained by dividing the interpolated image signal in each set by 4 (B/4) as a B image signal of the four pixels that constitute each set 220. As a result, the body control unit 14 can obtain a B image signal at a position of each pixel 30 as shown in FIG. 15(b).

The body control unit 14 executes the color interpolation processing as described above to obtain an image signal of RGB at a position of each pixel as shown in FIG. 16(a). The body control unit 14 obtains a luminance (brightness) signal Y at a position of each pixel 30 by using the image signal of RGB at a position of each pixel 30. For instance, the body control unit 14 defines 0.299R+0.587G+0.114B as the luminance signal Y.

In addition, the body control unit 14 defines a signal (R−Y) obtained by deducing a luminance signal Y from an R image signal at a position of each pixel 30 as a color difference (chrominance) signal Cr. The body control unit 14 defines a signal (B−Y) obtained by deducing a luminance signal Y from a B image signal at a position of each pixel 30 as a color difference (chrominance) signal Cb.

As a result, the body control unit 14 can obtain a luminance signal Y and color difference signals Cr and Cb at a position of each pixel 30 as shown in FIG. 16(b). The body control unit 14 generates an image file for recording by using the color image signals (YCrCb) thus obtained.

<Shooting Processing>

Figure 17:
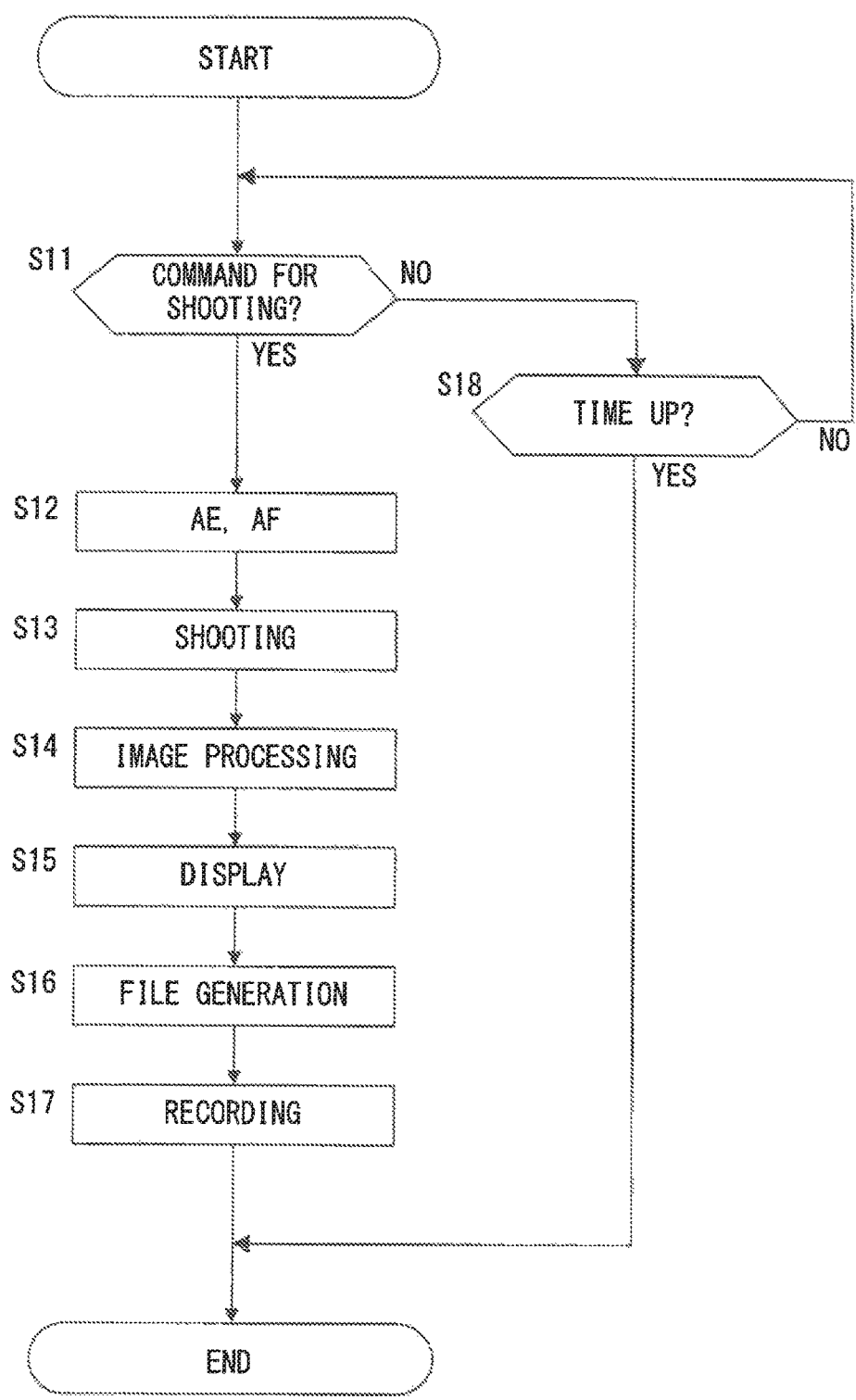
FIG. 17 A flowchart illustrating the flow of imaging processing.

FIG. 17 presents a flowchart illustrating the flow of imaging processing to be executed by the body control unit 14. The body control unit 14, when a main switch (not shown) that constitutes the operating member 18 is turned ON, controls the image sensor 12 to start photoelectric conversion at a predetermined frame rate to control the liquid crystal display element 16 to successively reproduce and display a through image based on the image signal and at the same starts up a program for executing the processing exemplified in FIG. 17. It is to be noted that the through image is an image for monitoring that is obtained before shooting is commanded.

In step S11 in FIG. 17, the body control unit 14 makes a decision as to whether or not a command for shooting is issued. When a release button that constitutes the operating member 18 is pushed down, the body control unit 14 makes a positive decision in step S11 and the program proceeds to step S12. When the release button is not pushed down, the body control unit 14 makes a negative decision in step S11 and the program proceeds to step S18.

In step S18, the body control unit 14 makes a decision as to whether or not time is up. When the body control unit 14 measures a predetermined time (for instance, 5 seconds), it makes a positive decision in step S18 and the processing in FIG. 17 is terminated. When the measured time is less than the predetermined time, the body control unit 14 makes a negative decision in step S18 and the program returns to step S11.

In step S12, the body control unit 14 executes AE processing and AF processing. In the AE processing, exposure is calculated on the basis of the level of image signal for the through image and aperture value AV and shutter speed TV are decided so that optimal exposure can be obtained. In the AF processing, the focus detection processing described above is executed based on an output signal sequence from the pixel row included in the set focus detection area. When the body control unit 14 completed execution of the AE and AF processing described above, the program proceeds to step S13.

In step S13, the body control unit 14 executes shooting processing and the program proceeds to step S14. Specifically, the body control unit 14 controls the diaphragm 6 based on the AV and controls the image sensor 12 to perform photoelectric conversion for recording for a storage time on the basis of the TV. In step S14, the body control unit 14 executes the image signal generation processing by using output signals from the image sensor 12 and the obtained image signal is subjected to predetermined image processing (gradation processing, contour enhancement, white balance adjustment processing and so on). When the body control unit 14 has executed the image processing, the program proceeds to step S15.

In step S15, the body control unit 14 controls the liquid crystal display element 16 to display the captured image thereon and the program proceeds to step S16. In step S16, the body control unit 14 generates an image file for recording and the program proceeds to step S17. In step S17, the body control unit 14 records the generated image file in a memory card 20 and terminates the processing in FIG. 17.

According to the embodiment described above, the following operations and advantageous effects can be obtained.

(1) As the digital camera 1 includes the image sensor 12 that captures an image of a subject by a light flux from a subject that passes through the interchangeable lens 2; the body control unit 14 that generates an image signal on the basis of output signals from the image sensor 12; and the body control unit 14 detecting a focusing condition of the interchangeable lens 2 by a phase detection method. The image sensor 12 has a pixel group and a microlens group arranged such that the light fluxes from the subject are guided to the pixel group; the pixel group includes an R pixel, a B pixel, and a G pixel having first, second, and third spectral sensitivities, respectively, arranged in a two-dimensional pattern; behind each microlens 40, there are arranged one R pixel, one B pixel and two G pixels in a two-by-two matrix, these four pixels each receive four light fluxes A through D, respectively, that pass four pupil regions 81 through 84, respectively, of the exit pupil 80. Further, the R pixel, the B pixel, and the G pixel are arranged such that pixels having substantially the same spectral sensitivities (that is, pixels of the same color) are adjacently arranged in a two-by-two matrix, whereas four pixels that are adjacent to the two-by-two matrix are arranged behind four different microlenses 40, respectively, such that their positions with respect to the microlenses 40 are different from each other. The body control unit 14 generates an image signal on the basis of output signals from the R pixel, the B pixel, and the G pixel and the body control unit 14 detects the focusing condition on the basis of an output from the G pixel. With this configuration, the generation of an image signal on the basis of an output signal from the image sensor 12 and the focus detection by the phase detection method can be performed without providing the image sensor 12 with any pixels dedicated for focus detection.

(2) In the digital camera 1 in (1) above, as a configuration is adopted such that the R pixels each have a red color filter, the B pixels each have a blue color filter, and the G pixels each have a green color filter, red green blue color image signals can be obtained from the output signals from the image sensor 12.

(3) In the digital camera 1 in (2) above, the pixel group is formed by arranging, in a two-dimensional pattern, a plurality of sets of pixels, each of which set includes four pixels arrayed in a two-by-two matrix behind one microlens 40, the sets include first through fourth sets in which arrangements pixels are different from each other. In the first set P1, an R pixel and a G pixel are arrayed horizontally adjacent to each other and a G pixel and a B pixel are arrayed adjacent to the horizontally arrayed R and G pixels, respectively, in the vertical direction. In the second set P2, a G pixel and an R pixel are arrayed horizontally adjacent to each other and a B pixel and a G pixel are arrayed adjacent to the horizontally arrayed G and R pixels, respectively, in the vertical direction. In the third set P3, a G pixel and a B pixel are arrayed horizontally adjacent and an R pixel and a G pixel are arrayed adjacent to the horizontally arrayed G and B pixels, respectively, in the vertical direction. In the fourth set P4, a B pixel and a G pixel are arrayed horizontally adjacent and a G pixel and an R pixel are arrayed adjacent to the horizontally arrayed G and B pixels, respectively, in the vertical direction. The first set P1 and the second set P2 are horizontally adjacent and alternately arrayed in a repeated manner in the horizontal direction. The third set P3 and the fourth set P4 are horizontally adjacent and alternately arrayed in a repeated manner in the horizontal direction. A first line L1 formed by the first set P1 and the second set P2 and a second line L2 formed by the third set P3 and the fourth set P4 are adjacent to each other in the vertical direction and alternately arrayed in a repeated manner in the vertical direction. With this configuration, focus detection by the phase detection method can be performed on the basis of an output signal from the image sensor 12 and any of the first through third image signal processing can be performed.

(4) In the digital camera 1 in (2) or (3) above, the body control unit 14 adds output signals from four adjacent R pixels in a two-by-two matrix, adds output signals from four adjacent B pixels in a two-by-two matrix, and adds output signals from four adjacent G pixels in a two-by-two matrix, thereby forming an image signal of a Bayer arrangement (that is, performing the second image signal generation processing). With this configuration, optimal image signals can be generated regardless of the incident angle of light into the microlenses 40. Furthermore, a conventional image processing engine that performs color interpolation of a Bayer arrangement can be used in the color interpolation processing.

(5) In the digital cameras 1 in (1) through (3), the body control unit 14 obtains three color signals at each position of microlens 40 on the basis of output signals from the R, B and G pixels arranged behind each of the microlenses 40 (that is, executes the first image signal generation processing). With this configuration, color image signals can be obtained without performing color interpolation processing.

(6) In the digital cameras 1 in (1) through (3), the body control unit 14 executes color interpolation processing for generating signals for two other spectral components at each position of R, B and G pixels to obtain three color signals and generates a luminance signal and color difference signals on the basis of the three color signals (that is, executes the third image signal generation processing). With this configuration, image signals having high resolutions can be obtained.

(7) In the digital cameras in (1) through (6) above, the body control unit 14 detects the focusing condition of the interchangeable lens 2 on the basis of outputs signals from a pair of pixels among the pixel group, the pair of pixels having substantially the same spectral sensitivities and having different positions with respect to the microlens 40. With this configuration, the focusing condition can be detected by a phase detection method appropriately based on the output signals from the image sensor 12.

(8) In the digital camera 1 in (3) above, the body control unit 14 detects the focusing condition of the interchangeable lens 2 in the horizontal direction on the basis of output signals from G pixels included in the first set P1 and the second set P2, respectively. With this configuration, the focusing condition can be detected in the horizontal direction of the image sensor 12 by the phase detection method appropriately based on the output signals from the image sensor 12.

(9) In the digital camera 1 in (3) above, the body control unit 14 detects the focusing condition of the interchangeable lens 2 in the vertical direction on the basis of output signals from G pixels included in the second set P2 and the fourth set P4, respectively. With this configuration, the focusing condition can be detected in the vertical direction of the image sensor 12 by the phase detection method appropriately based on the output signals from the image sensor 12.

(10) In the digital camera 1 in (3) above, the body control unit 14 detects the focusing condition of the interchangeable lens 2 in a direction oblique to the horizontal direction on the basis of output signals from G pixels included in the second set P2 and the third set P3, respectively. With this configuration, the focusing condition can be appropriately detected by the phase detection method in an oblique direction of the image sensor 12 on the basis of output signals from the image sensor 12.

Variation Example 1

In the embodiment described above, the focus detection processing is executed by using output signals from G pixels. However, the focus detection processing may also be performed by using output signals from R pixels or B pixels.

The body control unit 14 according to Variation Example 1 is configured to obtain AWB (auto white balance) evaluation values by using output signals from the image sensor 12. AWB evaluation values are cumulative values of output signals for each of R, G or B pixel. When the cumulative value for G pixel is low, it may be possible that output signals from G pixels cannot afford appropriate calculation of defocus amounts. Then, the body control unit 14 according to Variation Example 1 executes, when the cumulative value for G pixel is equal to or lower than a predetermined threshold value, the above-mentioned focus detection processing by using either one of R pixel and B pixel that has a greater cumulative value than the rest. With this configuration, appropriate focus detection processing can be executed even when shooting a subject having a small amount of G components.

Variation Example 2

In the embodiment described above, out of the first through third image signal generation processing, the processing that is indicated by initial setting is used to generate image signals for recording. However, the present invention is not limited thereto.

For instance, the body control unit 14 according to Variation Example 2, when a through image is to be displayed, selects the first image signal generation processing in which image signals can be generated without executing color interpolation processing and generates image signals by using the selected first image signal generation processing. On the other hand, for the images for recording, the third image signal generation processing capable of generating image signals having high resolutions is selected and image signals are generated by using the selected third image signal generation processing. As described above, the body control unit 14 according to Variation Example 2 is configured to select, upon image signal generation, any of the first, second and third image signal generation processing. With this configuration, image signal generation processing that is suitable for uses of images to be generated can be selected. For instance, the first image signal generation processing which does not require any color interpolation processing is selected in a scene where it is desired to display images on a real-time basis, whereas the third image signal generation processing is selected in a scene where it is desired to record images with high image quality.

In addition, the body control unit 14 may be configured to generate image signals by the first or second image signal generation processing for video images or by the third image signal generation processing for still images.

In addition, the body control unit 14 may be configured to generate image signals by using, for instance, both the first image signal generation processing and the second image signal generation processing. In this case, the body control unit 14 controls, for instance, both the image generated by the first image signal generation processing and the image generated by the second image signal generation processing to be displayed on a display device (not shown) on the rear side. The body control unit 14 records one of the two displayed images, which one is selected by the user through the operating member 18 into the memory card 20.

Variation Example 3

In the embodiment described above, the configuration is adopted in which the defocus amount in the horizontal direction is obtained on the basis of output signal from the pixel row 90 constituted by the G pixel (G-b) included in the first set P1 and the G pixel (G-a) included in the second set P2. However, the present invention is not limited thereto. A configuration may be adopted in which the defocus amount in the horizontal direction is obtained on the basis of output signals from a pixel row constituted by the G pixel (G-d) included in the third set P3 and the G pixel (G-c) included in the fourth set P4. Alternatively, the defocus amount in the horizontal direction may be obtained on the basis of both the above pixel row and the pixel row 90.

In addition, in the embodiment described above, the configuration is adopted in which the defocus amount in the vertical direction is obtained on the basis of output signals from the pixel row 120 constituted by the G pixel (G-a) included in the second set P2 and the G pixel (G-c) included in the fourth set P4. However, the present invention is not limited thereto. A configuration may be adopted in which the defocus amount in the vertical direction is obtained on the basis of output signals from a pixel row constituted by the G pixel (G-b) included in the first set P1 and the G pixel (G-d) included in the third set P3. Alternatively, the defocus amount in the horizontal direction may be obtained on the basis of both the above pixel row and the pixel row 120.

In the embodiment described above, the configuration is adopted in the oblique direction is obtained which the defocus amount in the vertical direction is obtained on the basis of output signals from the pixel row 150 constituted by the G pixels (G-a) and (G-d) included in the second set P2 and the G pixels (G-a) and (G-d) included in the third set P3. However, the present invention is not limited thereto. A configuration may be adopted in which the defocus amount in the oblique direction is obtained on the basis of the pixel row constituted by the G pixels (G-b) and (G-c) included in the first set P1 and the G pixels (G-b) and (G-c) included in the fourth set P4. Alternatively, the defocus amount in the oblique direction may be obtained on the basis of both the above pixel row and the pixel row 150.

Variation Example 4

In the embodiment described above, explanation has been made on the case in which color filters of primary color system (RGB) is used in the image sensor 12. However, color filters of a complementary color system may also be used.

Variation Example 5

In the embodiment described above, the present invention is applied to the digital camera 1 having a configuration such that the interchangeable lens 2 is mounted to the camera body 3. However, the present invention is not limited thereto. For instance, the present invention may also be applied to a lens-integrated digital camera.

Variation Example 6

In the third image signal generation processing in the embodiment described above, it is configured such that at a position of any particular one of R pixels and B pixels, output signals from four G pixels (G1 through G4) that located at positions nearest to the particular pixel are used (cf., FIG. 12). However, the present invention is not limited thereto. For instance, as shown in FIG. 18(*a*), a configuration may be adopted in which use is made of output signals from four pixels (G5 through G8) that are positioned in the horizontal direction or in the vertical direction with respect to an interpolation target pixel and that are near the interpolation target pixel. In this case, the body control unit 14 defines (aG5+bG6+cG7+dG8)/4 to be a G image signal of the interpolation target pixel. It is to be noted that a through d are coefficients that depend on respective distances of the near G pixels from the interpolation target pixel. The larger the distance from the interpolation target pixel, the larger the coefficient is set. In the case shown in FIG. 18(*a*), it is set a=b>c=d.

In addition, as shown in FIG. 18(*b*), a configuration may be adopted in which use is made of output signals from four G pixels (G9 through G12) adjacent via one intervening pixel in the horizontal direction or in the vertical direction to an interpolation target pixel. In this case, the body control unit 14 defines (G9+G10+G11+G12)/4 to be a G image signal of the interpolation target pixel since the four G pixels have the same distance from the interpolation target pixel. With this configuration, calculations weighted with coefficients can be omitted, so that calculation is made easier accordingly.

In addition, the interpolation processing shown in FIG. 12 and the interpolation processing shown in FIGS. 18(*a*) and (*b*) may be used in combination or one of them may be selected depending on the amount of calculation and/or accuracy of interpolation.

Variation Example 7

In the embodiment described above, the image sensor 12 may be a backside illumination (BSI: Backside Illumination) type one. The configuration of the image sensor 12 in this case is described as follows.

Figure 19:
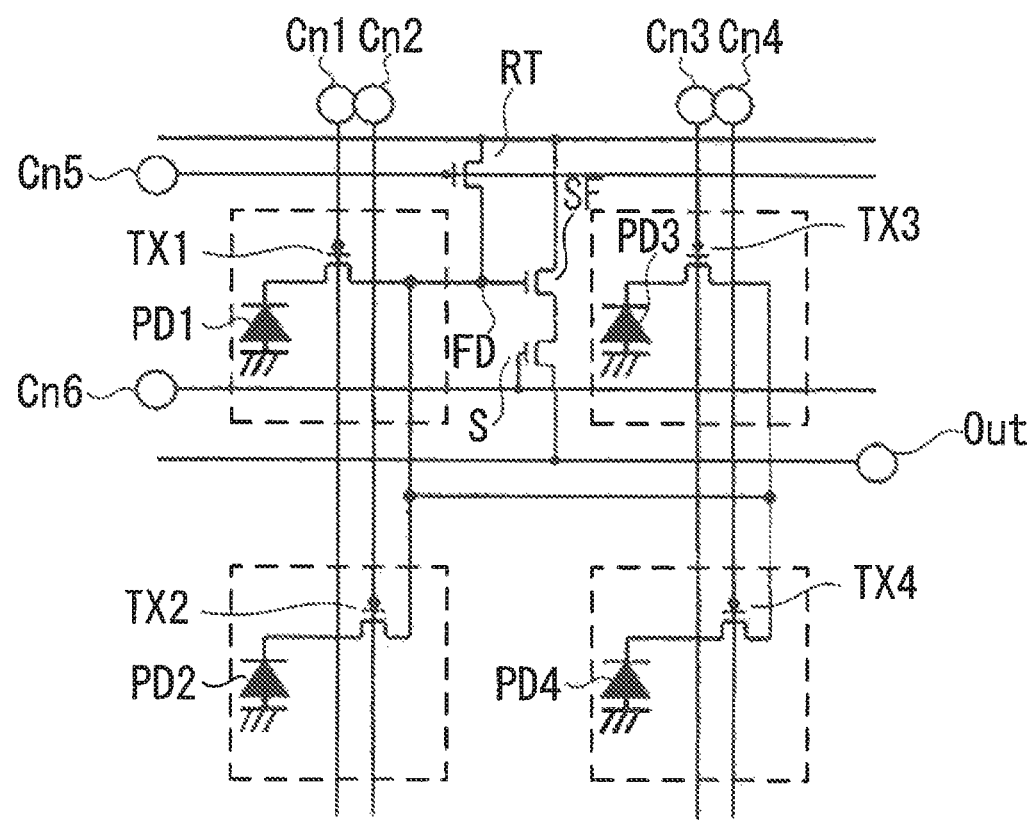
FIG. 19 A diagram illustrating by an example a circuit configuration of an image sensor.

FIG. 19 presents a diagram illustrating by an example a circuit configuration of the image sensor 12 according to Variation Example 7. In the image sensor 12 according to Variation Example 7, the circuitry is made up by grouping adjacent four pixels in a two-by-two matrix having the same color as one set. In FIG. 19, the circuit configuration of one set is exemplified.

Four photodiodes PD (PD1 through PD4) that correspond to four pixels, respectively, are connected to sources of transfer transistors TX (TX1 through TX4) that correspond to the photodiodes PD (PD1 through PD4), respectively. Gates of the transfer transistors TX1 through TX4 are connected to control lines Cn1 through Cn4, respectively, to which transfer pulse signals for turning on/off the transfer transistors TX1 through TX4 are supplied. Drains of the transfer transistors TX1 through TX4 are commonly connected to the source of a reset transistor RT. The gate of the reset transistor RT is connected to control line Cn5, to which a reset pulse signal for turning on/off the reset transistor RT is provided. So-called floating diffusion FD between each drain of the transfer transistors TX1 through TX4 and the source of the reset transistor RT is connected to the gate of a source follower amplifier transistor SF. The drain of the source follower amplifier transistor is connected to the source of a select transistor S. The gate of the select transistor S is connected to the control line Cn6, to which selection pulse signals for turning on/off the select transistor S are provided. The drain of the select transistor S is connected to an output line Out.

The four photodiodes PD1 through PD4 perform photoelectric conversion of light that has transmitted through each of color filters provided in correspondence to the respective photodiodes to generate signal charges. The signal charges generated by the four photodiodes PD1 through PD4 are transferred to the floating diffusion FD through the transfer transistors TX1 through TX4. Since the floating diffusion FD is connected to the gate of the source follower amplifier transistor SF, if the select transistor S is turned on, a signal corresponding to the potential of the floating diffusion FD, after amplification by the follower amplifier transistor SF, is output to the output line Out via the select transistor S. The reset transistor RT discharges signal charge of the floating diffusion FD to reset the floating diffusion FD.

It is to be noted that in the four photodiodes PD1 through PD4, the floating diffusion FD, the source follower amplifier transistor SF, the select transistor S, and the reset transistor RT are shared in common. Therefore, the image sensor 12 can output a signal for each photodiode PD or a signal obtained by adding signals from the four photodiodes PD1 through PD4.

FIGS. 20(a) and (b) present diagrams illustrating by an example the arrangement of the circuitry described above in the image sensor 12. In FIG. 20(a), 8×8 pixels, which are extracted as representatives, are illustrated. In addition, FIG. 20(b) presents an enlarged diagram showing a part of the 8×8 pixels that corresponds to one microlens 40 (corresponding to 2×2 pixels) in FIG. 20(a). As shown in FIG. 20, the floating diffusion FD, the source follower amplifier transistor SF, the select transistor S, and the reset transistor RT are shared, not by adjacent four pixels in a two-by-two matrix behind one microlens 40, but by adjacent four pixels in a two-by-two matrix having the same color. Therefore, it is possible to read out from the image sensor 12 a signal pixel after pixel or a signal obtained by adding signals from the adjacent four pixels in a two-by-two matrix having the same color. Accordingly, when RGB signals for the respective microlenses 40 are read out in the first image signal generation processing described later, it is only necessary to read out a signal pixel by pixel. In addition, in the second image signal generation processing, when the adjacent four pixels in a two-by-two matrix having the same color are treated as one pixel, it is only necessary to read out a signal obtained by adding the output signals from the adjacent four pixels in a two-by-two matrix having the same color from the image sensor 12.

In addition, in the case of the image sensor 12 of the backside illumination type, a wiring layer is provided on the surface side of a substrate and a photodiode PD is provided on the backside of the substrate, which is opposite to the wiring layer, and light is incident from the backside of the substrate. Therefore, in FIG. 20, the microlenses 40 and RGB color filters as well as circuit layout (wiring) are shown so that all of them can be seen. However, in an actual configuration, if the image sensor 12 is seen from the incident plane of light (backside of the substrate) as shown in FIG. 21(a), the microlenses and the corresponding RGB color filters are seen but the circuitry (wiring) is not seen, whereas if the image sensor 12 is seen from the side opposite to the incident plane of light (surface side of the substrate) as shown in FIG. 21(b), the circuitry (wiring) is seen but the microlenses 40 and the corresponding color filters are not seen. In the case of the image sensor 12 of the backside illumination type, the aperture of the photodiode PD is broader than the aperture of the photodiode in the conventional image sensor of the surface side illumination type, so that loss of light can be decreased to enable images to be captured with high sensitivity and at the same time, the accuracy of the focus detection processing described later can be increased.

Figure 22:
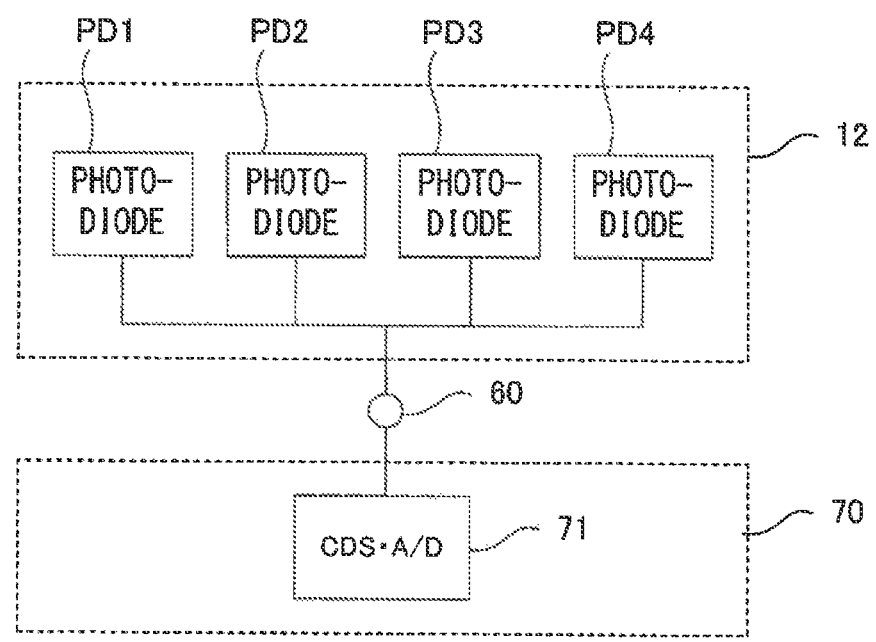
FIG. 22 A diagram illustrating by an example connection between an image sensor and a signal processing chip.

In addition, the image sensor (image sensor chip) 12 according to Variation Example 7 may have a stacked structure in which it is connected to a signal processing (DSP) chip 70 via a joint member 60 (for instance, a micro bump or the like). FIG. 22 is a schematic diagram illustrating connection between the image sensor 12 and the signal processing chip 70. The image sensor 12 and the signal processing chip 70 are stacked one above the other and connected with each other through a number of joint members 60. The joint member 60 is provided for each set of adjacent four pixels in a two-by-two matrix having the same color. It is to be noted that for convenience of explanation, only the part corresponding to one joint member 60 is illustrated.

The signal processing chip 70 is a chip that performs signal processing upon receipt of an output from the image sensor 12 and includes, for instance, a circuit 71 that performs correlated double sampling (CDS) and analog/digital (A/D) conversion. It is to be noted that the signal processing chip 70 may be provided with a memory and a calculation circuit.

Signals outputted from the photodiodes PD1 through PD4 of the image sensor 12 are inputted in the circuit 71 of the signal processing chip 70 via the joint member 60 and the circuit 71 performs correlated double sampling (CDS) and analog/digital (A/D) conversion for the signals.

Variation Example 8

The image sensor 12 according to the embodiment described above may be constituted by an image sensor of the surface side illumination type.

Variation Example 9

The image sensor (image sensor chip) 12 according to the embodiment described above may be formed as one chip together with the signal processing chip 70.

The above description is by way of example and the present invention is not limited to the embodiment described above. In addition, the embodiment described above may be combined with the configuration(s) of one or more of the variation examples in any desired manner.

The disclosure of the following priority application is herein incorporated by reference: Japanese Patent Application No. 2012-081167 (filed on Mar. 30, 2012).

The invention claimed is:

1. An image sensor comprising:
a first microlens;
a first filter that is transmissive to a first wavelength of light having passed through the first microlens;
a first photoelectric converter that generates charges by performing photoelectric conversion of the first wavelength light transmitted through the first filter;
a second filter that is transmissive to a second wavelength of the light having passed through the first microlens;
a second photoelectric converter that generates charges by performing photoelectric conversion of the second wavelength light transmitted through the second filter;
a second microlens;
a third filter that is transmissive to the first wavelength of light having passed through the second microlens;
a third photoelectric converter that generates charges by performing photoelectric conversion of the first wavelength light transmitted through the third filter;
a fourth filter that is transmissive to the second wavelength of light having passed through the second microlens;
a fourth photoelectric converter that generates charges by performing photoelectric conversion of the second wavelength light transmitted through the fourth filter;
a first output unit that outputs a first signal based upon at least one of the charges generated by the first photoelectric converter and the charges generated by the third photoelectric converter; and
a second output unit that outputs a second signal based upon at least one of the charges generated by the second photoelectric converter and the charges generated by the fourth photoelectric converter.

2. The image sensor according to claim 1, further comprising:
a first storage that stores at least one of the charges generated by the first photoelectric converter and the charges generated by the third photoelectric converter; and
a second storage that stores at least one of the charges generated by the second photoelectric converter and the charges generated by the fourth photoelectric converter.

3. The image sensor according to claim 2, wherein:
the first storage is shared by the first photoelectric converter and the third photoelectric converter; and
the second storage is shared by the second photoelectric converter and the fourth photoelectric converter.

4. The image sensor according to claim 2, wherein:
the first output unit outputs a signal based upon charges stored in the first storage; and
the second output unit outputs a signal based upon charges stored in the second storage.

5. The image sensor according to claim 1, further comprising a signal processing unit that processes at least one of the first signal output from the first output unit and the second signal output from the second output unit.

6. The image sensor according to claim 5, wherein: the signal processing unit comprises:
a first signal processing unit that processes the first signal output from the first output unit; and
a second signal processing unit that processes the second signal output from the second output unit.

7. The image sensor according to claim 6, further comprising:
an image sensor chip including the first photoelectric converter, the second photoelectric converter, the third photoelectric converter, the fourth photoelectric converter, the first output unit, and the second output unit; and
a signal processing chip that is provided with the signal processing unit and is stacked on the image sensor chip.

8. The image sensor according to claim 7, further comprising:
a first joint unit that is provided between the image sensor chip and the signal processing chip and that electrically connects the first output unit and the first signal processing unit to each other; and
a second joint unit that is provided between the image sensor chip and the signal processing chip and that electrically connects the second output unit and the second signal processing unit to each other.

9. The image sensor according to claim 5, wherein:
both of the first signal output from the first output unit and the second signal output from the second output unit are analog signals; and
the signal processing unit is a circuit that converts the analog signals into digital signals.

10. The image sensor according to claim 5, wherein:
the signal processing unit is a memory in which the first signal output from the first output unit and the second signal output from the second output unit are stored; or
the signal processing unit is a circuit that performs correlated double sampling for the first signal output from the first output unit and the second signal output from the second output unit.

11. And image-capturing device comprising:
the image sensor according to claim 1; and
a generation unit that generates image data based upon at least one of the first signal output from the first output unit and the second signal output from the second output unit.

12. An image-capturing device comprising:
the image sensor according to claim 1, which receives light having passed through an optical system; and
a control unit that controls a position of the optical system so that an image formed by the optical system is focused on the image sensor based upon at least one of the first signal output from the first output unit and the second signal output from the second output unit.

13. An image-capturing device comprising:
an image sensor including:
a first microlens;
a first filter that is transmissive to a first wavelength of light having passed through the first microlens;
a first photoelectric converter that generates charges by performing photoelectric conversion of the first wavelength light transmitted through the first filter;
a second filter that is transmissive to a second wavelength of the light having passed through the first microlens;
a second photoelectric converter that generates charges by performing photoelectric conversion of the second wavelength light transmitted through the second filter;
a second microlens;
a third filter that is transmissive to the first wavelength of light having passed through the second microlens;
a third photoelectric converter that generates charges by performing photoelectric conversion of the first wavelength light transmitted through the third filter;

a fourth filter that is transmissive to the second wavelength of light having passed through the second microlens; and a fourth photoelectric converter that generates charges by performing photoelectric conversion of the second wavelength light transmitted through the fourth filter; and an image generation unit that performs at least one of:

first image generation processing for generating a first image by using first signals based upon the charges generated by the first photoelectric converter and the charges generated by the third photoelectric converter and by using second signals based upon the charges generated by the second photoelectric converter and the charges generated by the fourth photoelectric converter; and second image generation processing for generating a second image by performing interpolation processing for at least one of a signal based upon the charges generated by the second photoelectric converter and a signal based upon the charges generated by the fourth photoelectric converter by using the first signals based upon the charges generated by the first photoelectric converter and the charges generated by the third photoelectric converter.

14. The image-capturing device according to claim 13, wherein in the first image generation processing, the first image is generated by using a signal based upon charges obtained by adding the charges generated by the first photoelectric converter and the charges generated by the third photoelectric converter and a signal based upon charges obtained by adding the charges generated by the second photoelectric converter and the charges generated by the fourth photoelectric converter.

15. The image-capturing device according to claim 13, wherein in the second image generation processing, the second image is generated by further performing interpolation processing for at least one of a signal based upon the charges generated by the first photoelectric converter and a signal based upon the charges generated by the third photoelectric converter by using the second signals based upon the charges generated by the second photoelectric converter and the charges generated by the fourth photoelectric converter.

16. The image-capturing device according to claim 13, further comprising:

a display that displays thereon the first image generated by the image generation unit in the first image generation processing; and a memory that records image data of the second image generated by the image generation unit in the second image generation processing.

17. The image-capturing device according to claim 13, wherein the image generation unit generates video images by performing the first image generation processing and generates still images by performing the second image generation processing.

18. The image-capturing device according to claim 13, wherein:

the first filter is provided adjacent to the third filter; and
the second filter is provided adjacent to the fourth filter.

* * * * *